United States Patent
Shiomi et al.

(10) Patent No.: US 8,502,310 B2
(45) Date of Patent: Aug. 6, 2013

(54) III NITRIDE SEMICONDUCTOR ELECTRONIC DEVICE, METHOD FOR MANUFACTURING III NITRIDE SEMICONDUCTOR ELECTRONIC DEVICE, AND III NITRIDE SEMICONDUCTOR EPITAXIAL WAFER

(75) Inventors: Hiromu Shiomi, Itami (JP); Kazuhide Sumiyoshi, Osaka (JP); Yu Saitoh, Itami (JP); Makoto Kiyama, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 225 days.

(21) Appl. No.: 13/124,934

(22) PCT Filed: Oct. 20, 2009

(86) PCT No.: PCT/JP2009/068069
§ 371 (c)(1),
(2), (4) Date: Apr. 19, 2011

(87) PCT Pub. No.: WO2010/047331
PCT Pub. Date: Apr. 29, 2010

(65) Prior Publication Data
US 2011/0198693 A1 Aug. 18, 2011

(30) Foreign Application Priority Data
Oct. 24, 2008 (JP) ................... 2008-274370

(51) Int. Cl.
*H01L 29/66* (2006.01)
(52) U.S. Cl.
USPC ................ 257/339; 257/493; 257/E21.108; 438/493

(58) Field of Classification Search
USPC .............. 257/339, 493, E21.108; 438/493
IPC .............. H01L 21/02241, 21/182, 21/28264, H01L 21/28575, 33/0062
See application file for complete search history.

(56) References Cited

FOREIGN PATENT DOCUMENTS

| CN | 1670918 | 9/2005 |
|---|---|---|
| EP | 1633003 | 3/2006 |

(Continued)

OTHER PUBLICATIONS

Y. Irokawa et al., "Current-voltage and reverse recovery characteristics of bulk GaN p-i-n rectifiers", Appl. Phys. Lett., vol. 83, No. 11, Sep. 2003, pp. 2271-2272.

(Continued)

*Primary Examiner* — Eva Yan Montalvo
(74) *Attorney, Agent, or Firm* — Drinker Biddle & Reath LLP

(57) ABSTRACT

Provided is a III nitride semiconductor electronic device having a structure capable of reducing leakage current. A laminate 11 includes a substrate 13 and a III nitride semiconductor epitaxial film 15. The substrate 13 is made of a III nitride semiconductor having a carrier concentration of more than $1 \times 10^{18}$ cm$^{-3}$. The epitaxial structure 15 includes a III nitride semiconductor epitaxial film 17. A first face 13a of the substrate 13 is inclined at an angle θ of more than 5 degrees with respect to an axis Cx extending in a direction of the c-axis. A normal vector VN and a c-axis vector VC make the angle θ. The III nitride semiconductor epitaxial film 17 includes first, second and third regions 17a, 17b and 17c arranged in order in a direction of a normal to the first face 13a. A dislocation density of the third region 17c is smaller than that of the first region 17a. A dislocation density of the second region 17b is smaller than that of the substrate 13.

20 Claims, 10 Drawing Sheets

FOREIGN PATENT DOCUMENTS

| | | |
|---|---|---|
| EP | 1970946 | 9/2008 |
| JP | 2000-044400 | 2/2000 |
| JP | 2001-120497 | 5/2001 |
| JP | 2002-016000 | 1/2002 |
| JP | 2003-112999 | 4/2003 |
| JP | 2006-100801 | 4/2006 |
| JP | 2006-196623 | 7/2006 |
| JP | 2006-306722 | 11/2006 |
| JP | 2007-299793 | 11/2007 |
| JP | 2008-211228 | 9/2008 |
| WO | 2008/059875 | 5/2008 |

OTHER PUBLICATIONS

P. Kozodoy et al., "Electrical characterization of GaN p-n junctions with and without threading dislocations", Appl. Phys. Lett., vol. 73, No. 7, Aug. 1998, pp. 975-977.

Fig.3
(a)
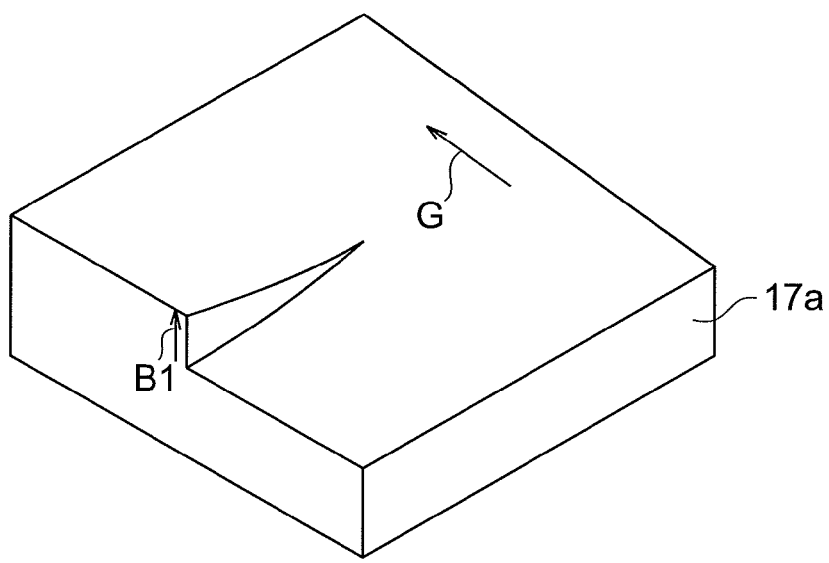
(b)
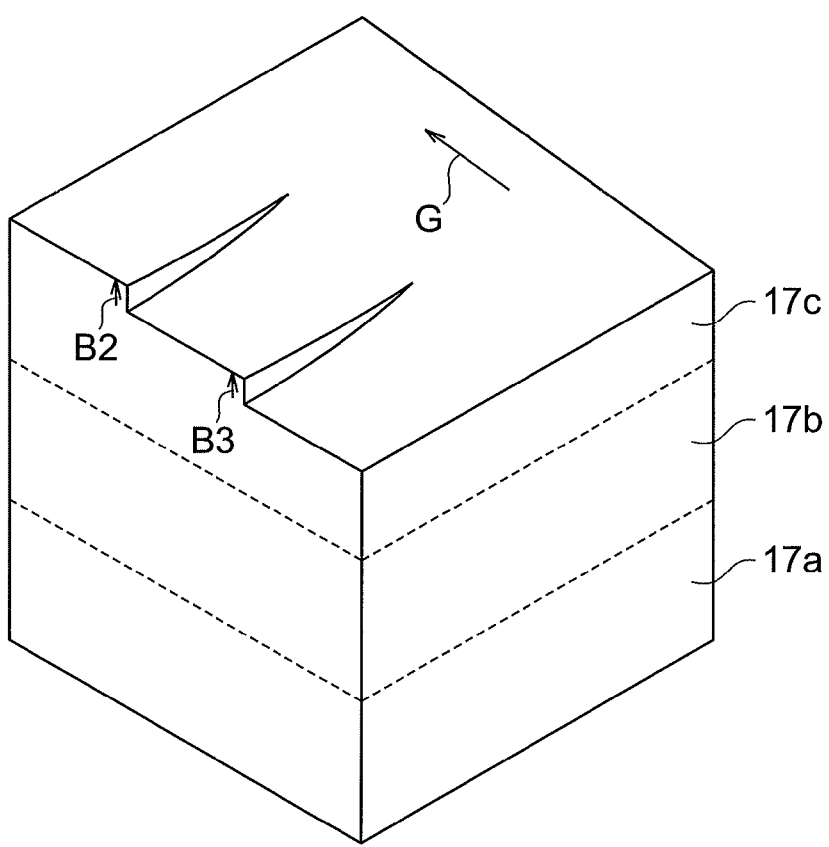

Fig.4
(a)
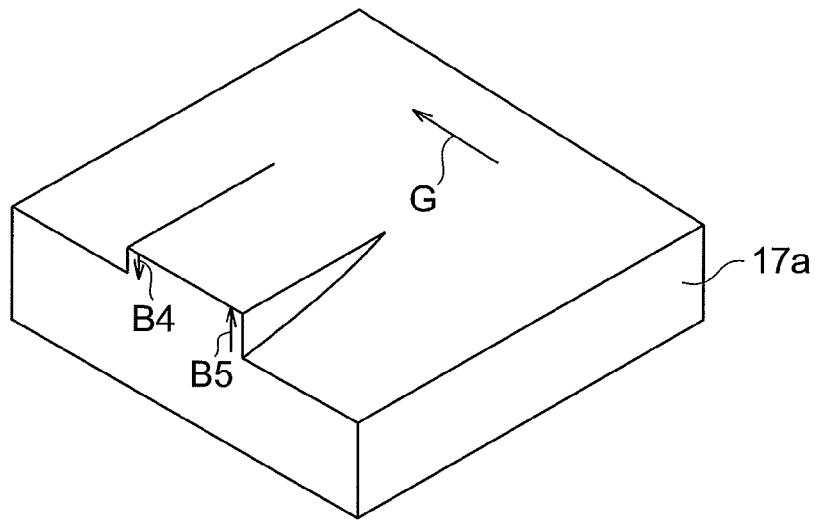
(b)
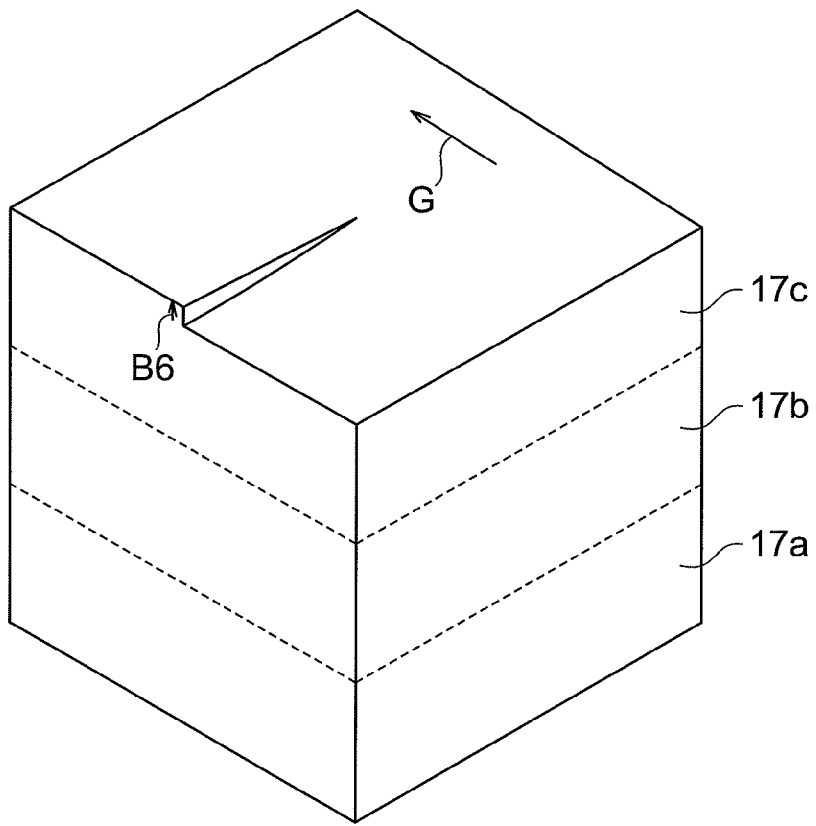

Fig.8
(a)
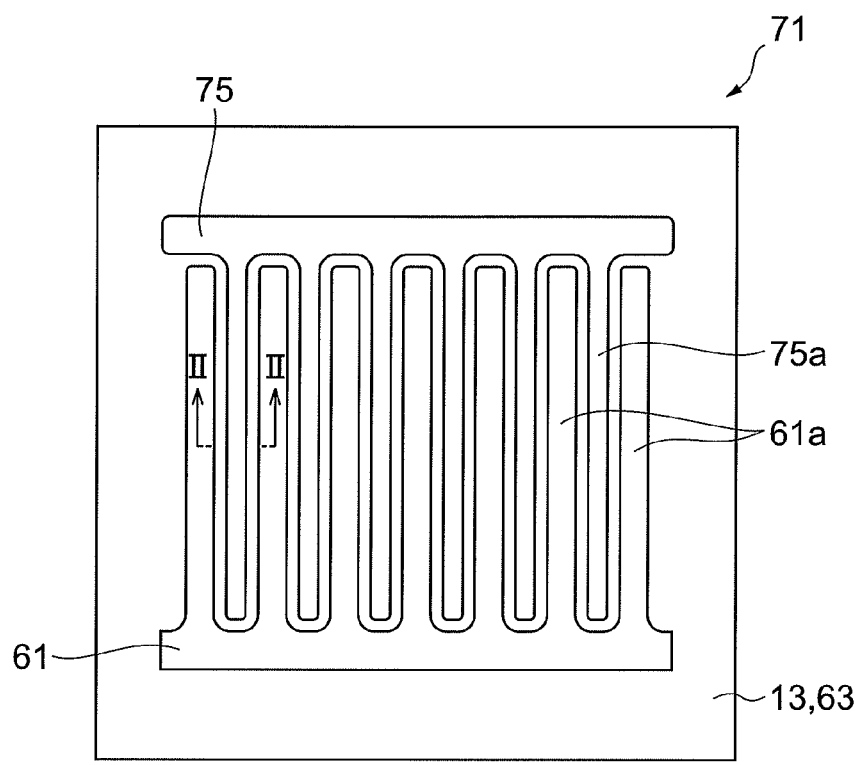
(b)
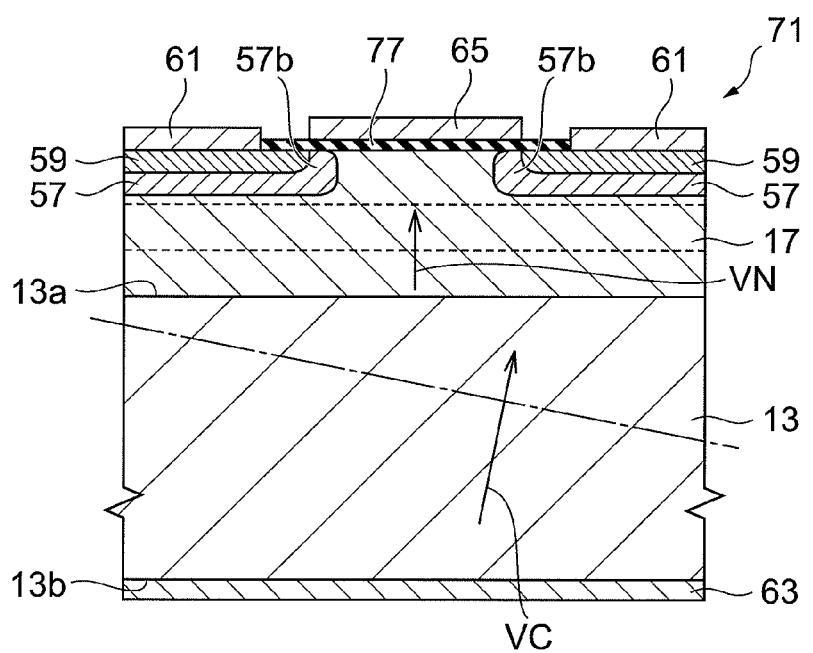

Fig.9
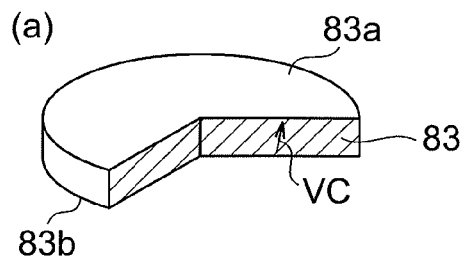
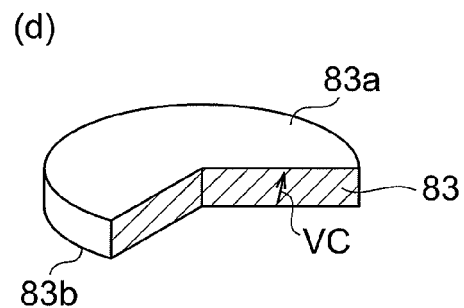
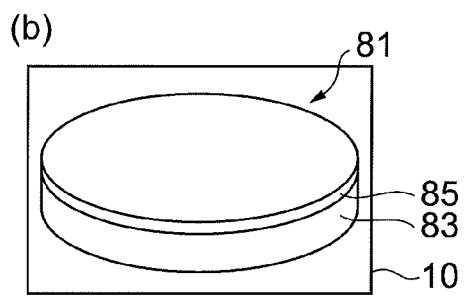
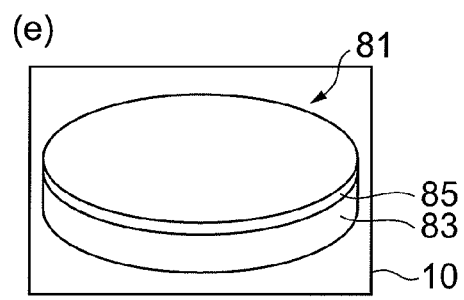
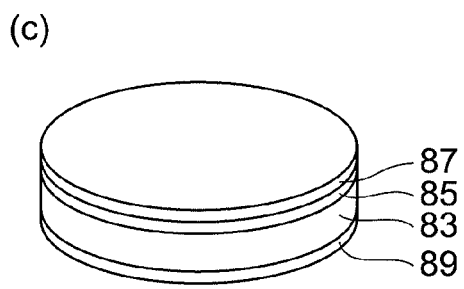
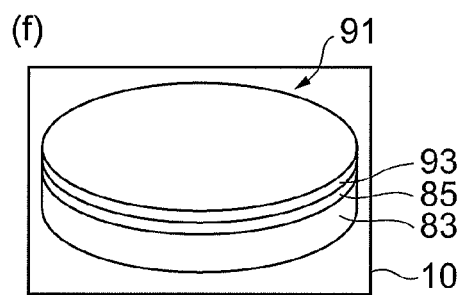
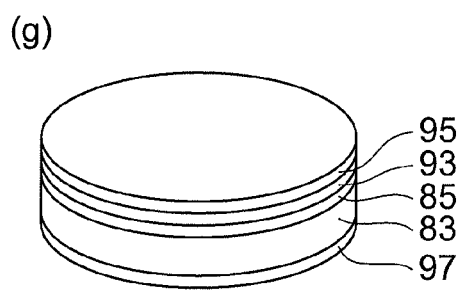

Fig.10
(a)
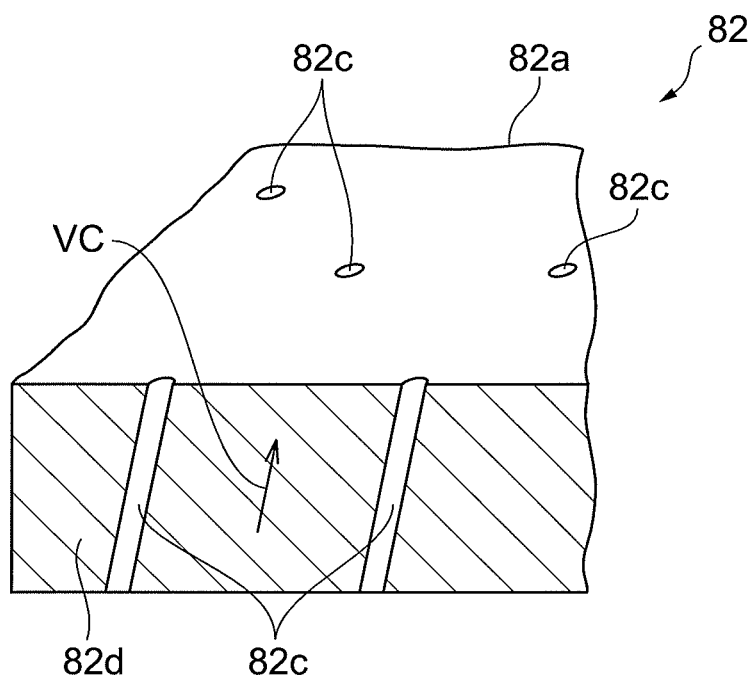
(b)
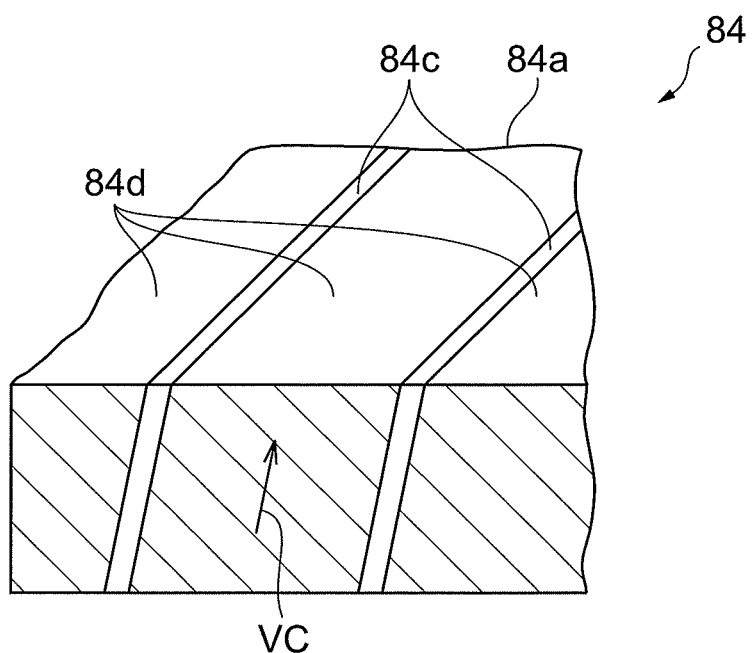

III NITRIDE SEMICONDUCTOR ELECTRONIC DEVICE, METHOD FOR MANUFACTURING III NITRIDE SEMICONDUCTOR ELECTRONIC DEVICE, AND III NITRIDE SEMICONDUCTOR EPITAXIAL WAFER

TECHNICAL FIELD

The present invention relates to a III nitride semiconductor electronic device, a method for manufacturing a III nitride semiconductor electronic device, and a III nitride semiconductor epitaxial wafer.

BACKGROUND ART

Patent Literature 1 describes a nitride semiconductor laser. This nitride semiconductor laser is produced on a primary surface of a gallium nitride substrate. The primary surface of the gallium nitride substrate is inclined at an angle of not less than 13 degrees and not more than 90 degrees from a (0001) plane of gallium nitride. This reduces compositional separation in an active layer of the nitride semiconductor laser.

Patent Literature 2 describes a semiconductor substrate of wurtzite-type gallium nitride. The primary surface of this semiconductor substrate is inclined at an angle of not less than 45 degrees and not more than 65 degrees from a (0001) plane to the <10-10> direction.

Patent Literature 3 describes a Schottky diode, a pn junction diode, and an MIS type transistor. These semiconductor devices are produced on a gallium nitride free-standing substrate. The primary surface of the gallium nitride free-standing substrate is inclined at an angle in the range of not more than +5 degrees and not less than −5 degrees from a (0001) plane.

Patent Literature 4 describes a Schottky diode, a pn junction diode, and an MIS type transistor. For example, it shows a relation between composite off-angle and effective carrier concentration.

Non Patent Literature 1 describes pin diodes. The pin diodes have epitaxial layers grown on a GaN free-standing substrate. The forward turn-on voltage is about 5 volts at the temperature of 300. Celsius degrees. A thick film used as the GaN free-standing substrate is grown on an $Al_2O_3$ substrate by a hydride vapor phase epitaxial (HVPE) method. This thick film is separated from the $Al_2O_3$ substrate by irradiation with a laser beam to produce the GaN free-standing substrate. On this GaN free-standing substrate, an undoped nitride semiconductor film is grown in the thickness of 3 micrometers by the metal-organic vapor phase epitaxial method. Next, an Mg-doped nitride semiconductor film is grown in the thickness of 0.3 micrometers on this undoped nitride semiconductor film. The GaN free-standing substrate, undoped nitride semiconductor film, and Mg-doped nitride semiconductor film constitute a pin structure.

Non Patent Literature 2 describes characteristics of nitride semiconductor pin junctions. First, a GaN film is formed in the thickness of 2 micrometers on a c-plane sapphire substrate by the metal-organic vapor phase epitaxial process using a $SiO_2$ mask for LEO regrowth. A pattern of the mask is stripes with apertures of 5 micrometers at intervals of 45 micrometers. In LEO growth, a nitride semiconductor grows perpendicularly to the apertures of the mask and overgrows horizontally on the mask. The height of the grown nitride semiconductor and the length of overgrowth each are about 8 micrometers. A pn junction diode is formed on this LEO nitride semiconductor part. This pn junction diode includes an undoped n-type GaN film in the thickness of 1 micrometer, and an Mg-doped p-type GaN film in the thickness of 0.5 micrometers grown thereon. The size of the pn junction diode is 2 micrometers×20 micrometers.

CITATION LIST

Patent Literature

Patent Literature 1: Japanese Patent Application Laid-open No. 2001-120497
Patent Literature 2: Japanese Patent Application Laid-open No. 2003-112999
Patent Literature 3: Japanese Patent Application Laid-open No. 2006-100801
Patent Literature 4: Japanese Patent Application Laid-open No. 2007-299793

Non Patent Literature

Non Patent Literature 1: Y Irokawa et al., Appl. Phys. Lett. Vol. 83, No. 11, Sep. 15, 2003
Non Patent Literature 2: P Kozodoy et al., Appl. Phys. Lett. Vol. 73, No. 7, 17 Sep., 1998

SUMMARY OF INVENTION

Technical Problem

The gallium nitride-based semiconductor electronic devices include the gallium nitride semiconductor film epitaxially grown on the primary surface of the gallium nitride substrate. Specifically, the primary surface of the gallium nitride substrate has the off angle of within 1 degree from the c-plane.

In the nitride semiconductor pn junction diode of Non Patent Literature 2, the reverse-bias leakage current in areas of low dislocation density is less than $10^6$ $cm^{-2}$, while the reverse-bias leakage curren in areas of high dislocation density is approximately $4 \times 10^8$ $cm^{-2}$. The reverse-bias leakage current in the areas of low dislocation density can be made smaller than that in the areas of high dislocation density, and this indicates that reduction of dislocations can improve the breakdown voltage. However, the device structure of this literature is so complicated as to be infeasible to fabricate the device in the areas of low dislocation density in practice.

In Non Patent Literature 1, the pn junction diodes are formed on the LEO nitride semiconductor part and accordingly, the diodes made of the nitride semiconductors demonstrate the large leakage current. Therefore, the reverse breakdown voltage of the pin diodes in Non Patent Literature 1 is not satisfactorily high, either.

In order to ensure a desired amount of electric current, a power device requires a large chip area. For example, the chip size of not less than 1 square millimeter (e.g., 1 mm×1 mm) is required for flow of electric current of about 6 A. Furthermore, the chip size of 25 square millimeters (e.g., 5 mm×5 mm) is needed for flow of electric current of up to about 100 A. In an electronic device of a certain level of size, an electrode is framed on a region with a large density of crystal defects such as dislocations in a nitride semiconductor crystal. These defects cause increase in leakage current of the electronic device. In a power device performing switching operation, the leakage current also flows during switch-off periods. It will become not functioning as a switching device, depending upon the level of leakage current.

The semiconductor devices of nitride semiconductors have been heretofore put into practical use as light emitting diodes or laser diodes. These light emitting devices have the device size at most several hundred sq. micrometer. The light emitting devices of this size can be fabricated on a low-defect nitride semiconductor epitaxial region. In addition, an important factor in the field of light emitting devices is improvement in luminous efficiency and, therefore, the perspective of improvement of characteristics in the field of light emitting devices has been directed toward improvement in luminous efficiency rather than reduction in leakage current. A forward bias is applied to the light emitting devices during operation thereof.

On the other hand, efforts to improve the reduction in leakage current have been made heretofore for the electronic devices used as switching devices. Further reduction in leakage current is desired therein.

According to the inventors' knowledge, the mechanism of leakage current generation in the nitride semiconductor devices is as described below. When the reverse bias voltage is applied to the Schottky junction and pn junction, the field intensity has the maximum at the junction interface thereof. If a crystal defect exists at the junction interface, carriers such as electrons and/or holes in the defect will be a source of generation of reverse leakage current. Furthermore, a crystal defect induces internal stress in a crystal lattice. For example, if it is compressive stress, impurity atoms with a small atomic radius will be highly likely to segregate at the crystal defect; if it is tensile stress, atoms with a large atomic radius will be highly likely to segregate at the crystal defect. Some of the segregated impurity atoms act as donors and acceptors to supply carriers such as electrons and holes. These carriers can also be a generation source of leakage current.

An object of the present invention is to provide a III nitride semiconductor electronic device having a structure capable of reducing the leakage current, and another object of the invention is to provide a method of fabricating the III nitride semiconductor electronic device. A further object of the present invention is to provide a III nitride semiconductor epitaxial wafer.

Solution to Problem

A first aspect of the present invention relates to a III nitride semiconductor electronic device. The III nitride semiconductor electronic device comprises: (a) a support base of a III nitride semiconductor having a carrier concentration of more than $1 \times 10^{18}$ cm$^{-3}$, the support base including a first face and a second face opposite to the first face; and (b) a first III nitride semiconductor epitaxial layer provided on the first face of the support base. The III nitride semiconductor epitaxial layer makes a junction with the first face of the support base. The first face of the support base is inclined at an angle of more than 5 degrees with respect to a reference axis, and the reference axis extending in a direction of the c-axis of the III nitride semiconductor. The first III nitride semiconductor epitaxial layer includes first, second and third regions arranged in order in a direction of a normal to the first face. A dislocation density of the second region is smaller than a dislocation density of the support base, and a dislocation density of the third region is smaller than a dislocation density of the first region.

Another aspect of the present invention is a method for manufacturing a III nitride semiconductor electronic device. This method comprises: the steps of: (a) preparing a wafer of a III nitride semiconductor, the III nitride semiconductor having a carrier concentration of more than $1 \times 10^{18}$ cm$^{-3}$, the wafer having a primary surface inclined at an angle of more than 5 degrees with respect to a reference axis, and the reference axis extending in a direction of a c-axis of the III nitride semiconductor; and (b) growing a first III nitride semiconductor epitaxial layer on the primary surface of the wafer. The III nitride semiconductor epitaxial layer makes a junction with the primary surface of the wafer, and the first III nitride semiconductor epitaxial layer includes first, second, and third regions arranged in order in a direction of a normal to the primary surface. A dislocation density of the second region is smaller than a dislocation density of the support base, and a dislocation density of the third region is smaller than a dislocation density of the first region.

Still another aspect of the present invention is a III nitride semiconductor epitaxial wafer for a III nitride semiconductor electronic device. This epitaxial wafer comprises: (a) a wafer of a III nitride semiconductor, the III nitride semiconductor having a carrier concentration of more than $1 \times 10^{18}$ cm$^{-3}$, and the wafer including a first face and a second face opposite to the first face; and (b) a first III nitride semiconductor epitaxial layer provided on the first face of the wafer, the III nitride semiconductor epitaxial film making a junction with the first face of the wafer, the first face of the wafer being inclined at an angle of more than 5 degrees with respect to a reference axis, and the reference axis extending in a direction of the c-axis of the III nitride semiconductor. The first III nitride semiconductor epitaxial layer includes first, second and third regions, the first, second and third regions being arranged in order in a direction of a normal to the first face. A dislocation density of the second region is smaller than a dislocation density of the supporting base, and a dislocation density of the third region is smaller than a dislocation density of the first region.

According to the invention as to the foregoing aspects, the first face of the substrate, the support base or the wafer is inclined at the angle of more than 5 degrees relative to the reference axis, and the first III nitride semiconductor epitaxial layer is grown on the substrate; therefore, the threading dislocation density in the III nitride semiconductor decreases as deposition of the III nitride semiconductor proceeds. Hence, the dislocation density of the second region of the III nitride semiconductor epitaxial layer is smaller than that of the substrate, and the dislocation density of the third region is smaller than that of the first region in the first III nitride semiconductor epitaxial layer.

Threading dislocations exist in the semiconductor film epitaxially grown on the substrate, and these threading dislocations are inherited from the substrate. The conventional gallium nitride-based semiconductor electronic devices do not have any structure that brings out technical contribution from decomposition of dislocation. However, when the thickness of the first III nitride semiconductor epitaxial layer is not less than 3 micrometers and the off angle of the substrate is over 5 degrees, the threading dislocations can be decomposed by step flow growth in this epitaxial growth according to Inventors' knowledge.

The decomposition of threading dislocation permits the spatial dispersion of dislocations, thereby avoiding local concentration of dislocations. By the decomposition of threading dislocation, a dislocation of a large Burgers vector can be decomposed into a plurality of dislocations of smaller Burgers vectors, which can reduce local strain in the crystal. Furthermore, by the decomposition of threading dislocation, the frequency of incorporation of dislocations increases on the contrary and this incorporation can decrease the dislocation density and can also make the Burgers vectors of dislocations smaller. In this manner, the decomposition of threading dislocation permits provision of the III nitride semiconductor electronic device making use of crystals having an excellent quality, the method for fabricating the III nitride semiconductor electronic device, and the epitaxial wafer for the III nitride semiconductor electronic device.

In the present invention, a surface of the first III nitride semiconductor epitaxial layer can have a morphology which includes a step of plural crystal planes. According to this invention, since the surface of the III nitride semiconductor epitaxial film exhibits the final stage of growth of the III nitride semiconductor epitaxial film, when the aforementioned morphology appears in the surface of the III nitride semiconductor epitaxial film, the decomposition of dislocation occurs in the III nitride semiconductor epitaxial film as would be expected. As a consequence of this, the local strain due to dislocations is reduced in the III nitride semiconductor epitaxial film.

In the present invention, the first face of the support base can be inclined at the angle of not less than 20 degrees relative to the reference axis. According to this invention, when the inclination angle is not less than 20 degrees, fine steps is formed and the decomposition of dislocation occurs in the III nitride semiconductor epitaxial film in good order. This results in reducing the local strain due to dislocations in the III nitride semiconductor epitaxial film.

In the present invention, the first face of the support base can be inclined at the angle of not less than 40 degrees and not more than 80 degrees with respect to the reference axis. According to this invention, when the inclination angle is not less than 40 degrees, the step density is made larger and the decomposition of dislocation occurs in the III nitride semiconductor epitaxial film. The inclination angle of not more than 80 degrees can prevent the step density from becoming too small because of inclination of the primary surface from the a-plane and m-plane. This results in reducing the local strain due to dislocations in the III nitride semiconductor epitaxial film.

In the present invention, the first face of the support base has first and second areas, a dislocation density of the first area is not more than $1\times10^8$ cm$^{-2}$, and a dislocation density of the second area can be larger than $1\times10^8$ cm$^{-2}$.

According to this invention, a major part of the electronic device can be fabricated in the first area. When the dislocation density is not more than $1\times10^8$ cm$^{-2}$, a desired level of dislocation density is achieved through the decomposition of dislocation.

In the present invention, a thickness of the first III nitride semiconductor epitaxial layer can be not less than 3 micrometers, and a carrier concentration of the first III nitride semiconductor epitaxial layer can be not less than $1\times10^{14}$ cm$^{-3}$ and not more than $1\times10^{17}$ cm$^{-3}$. According to this invention, the electronic device with a desired reverse breakdown voltage can be attained by contributions from the carrier concentration and the reduction of dislocations.

In the present invention, a thickness of the first III nitride semiconductor epitaxial layer can be not less than 5 micrometers, and a carrier concentration of the first III nitride semiconductor epitaxial layer can be not less than $1\times10^{14}$ cm$^{-3}$ and not more than $2\times10^{16}$ cm$^{-3}$. According to this invention, when the thickness of the first III nitride semiconductor epitaxial layer is not less than 5 micrometers, the dislocation density in the surface portion thereof becomes lower because of the decomposition of dislocation.

In the present invention, a thickness of the first III nitride semiconductor epitaxial layer can be not more than 100 micrometers. According to this invention, if the thickness of the first III nitride semiconductor epitaxial layer is more than 100 micrometers, the device will be more susceptible to increase of crystal defects formed in long-haul crystal growth, rather than the dislocation reduction effect.

The III nitride semiconductor electronic device according to the present invention can further comprise a Schottky electrode making a Schottky junction with the first III nitride semiconductor epitaxial layer. This invention can provide the electronic device having the Schottky electrode.

The III nitride semiconductor electronic device according to the present invention can further comprise: a second III nitride semiconductor epitaxial layer provided on the first III nitride semiconductor epitaxial layer; and an ohmic electrode making an ohmic contact with the second III nitride semiconductor epitaxial layer. The second III nitride semiconductor epitaxial layer has a conductivity type opposite to a conductivity type of the first III nitride semiconductor epitaxial layer. The second III nitride semiconductor epitaxial layer forms a pn junction with the first III nitride semiconductor epitaxial layer. This invention can provide the electronic device having the pn junction.

In the present invention, the second III nitride semiconductor epitaxial layer and the first III nitride semiconductor epitaxial layer can form a homojunction. When the III nitride semiconductor electronic device is constructed in this manner, the technical contribution from the decomposition of dislocation can be achieved in the electronic device using formation of the pn junction.

In the present invention, the second III nitride semiconductor epitaxial layer can include first, second, and third regions arranged in order in the direction of the axis normal to the first face, and a dislocation density of the third region of the second III nitride semiconductor epitaxial layer can be smaller than a dislocation density of the first region of the second III nitride semiconductor epitaxial layer. According to this invention, the dislocation density can be reduced by the decomposition of dislocation in the second III nitride semiconductor epitaxial layer.

The III nitride semiconductor electronic device according to the present invention can comprise: a source region of an n-type III nitride semiconductor; a separation region, provided between the first III nitride semiconductor film and the source region, of a p-type III nitride semiconductor; an insulating film provided on a surface of the separation region; and a gate electrode for changing a potential on the surface of the separation region through the insulating film. A conductivity type of the first III nitride semiconductor epitaxial layer is n-type. According to this invention, the electronic device is provided in the transistor structure through electrons.

In the present invention, in the first III nitride semiconductor epitaxial layer, a dislocation having a first Burgers vector is decomposed into plural dislocations, and the first Burgers vector is equal to the sum of Burgers vectors of the respective dislocations. In the present invention, in the first III nitride semiconductor epitaxial layer, a dislocation having a second Burgers vector incorporates with a dislocation having a third Burgers vector, and the third Burgers vector has a component in a direction opposite to the second Burgers vector.

In the method of fabricating the III nitride semiconductor electronic device and the epitaxial wafer according to the present invention, the first III nitride semiconductor epitaxial layer can be grown by either of a metal-organic vapor phase epitaxial method and an HVPE method. The decomposition of dislocation occurs during the growth by these methods.

The method of fabricating the III nitride semiconductor electronic device and the epitaxial wafer according to the present invention can further comprise the step of forming a Schottky electrode on the first III nitride semiconductor epitaxial layer. This method can provide the electronic device with the Schottky electrode.

The method of fabricating the III nitride semiconductor electronic device and the epitaxial wafer according to the present invention can further comprise: the steps of: growing a second III nitride semiconductor epitaxial layer on the first III nitride semiconductor epitaxial layer; and forming an ohmic electrode on the second III nitride semiconductor epitaxial layer. The second III nitride semiconductor epitaxial layer has a conductivity type opposite to a conductivity type of the first III nitride semiconductor epitaxial layer. According to the method, the technical contribution from the decomposition of dislocation can be achieved in the electronic device using the pn junction.

The epitaxial wafer according to the present invention can further comprise a second III nitride semiconductor epitaxial layer provided on the first III nitride semiconductor epitaxial layer. The second III nitride semiconductor epitaxial layer has a conductivity type opposite to a conductivity type of the first III nitride semiconductor epitaxial layer.

The above objects and other objects, features, and advantages of the present invention will more readily become clear from the following detailed description of the preferred embodiments of the present invention proceeding with reference to the accompanying drawings.

Advantageous Effects of Invention

As described above, the first aspect of the present invention provides the III nitride semiconductor electronic device having the structure capable of reducing the leakage current. The second aspect of the present invention provides the method for manufacturing the III nitride semiconductor electronic device. Furthermore, the third aspect of the present invention has the object to provide the epitaxial wafer for the III nitride semiconductor electronic device.

BRIEF DESCRIPTION OF DRAWINGS

FIG. 3 is a drawing schematically showing decomposition of a threading dislocation.

FIG. 4 is a drawing schematically showing incorporation of threading dislocations.

FIG. 8 is a drawing showing an MIS type transistor according to an embodiment of the present invention.

FIG. 9 is a drawing showing major steps in a method for fabricating an epitaxial wafer and a method for a III nitride semiconductor electronic device according to an embodiment of the present invention.

FIG. 10 is a drawing showing examples of arrangements of high-dislocation and low-dislocation regions in a GaN freestanding substrate.

EMBODIMENTS OF INVENTION

The expertise of the present invention can be readily understood in view of the following detailed description with reference to the accompanying drawings presented by way of illustration. Embodiments of the III nitride semiconductor electronic device, the method for manufacturing the III nitride semiconductor electronic device, the method for manufacturing the epitaxial wafer, and the epitaxial wafer for the III nitride semiconductor electronic device according to the present invention is described below with reference to the accompanying drawings. The same portions will be denoted by the same reference signs, as much as possible.

Figure 1:
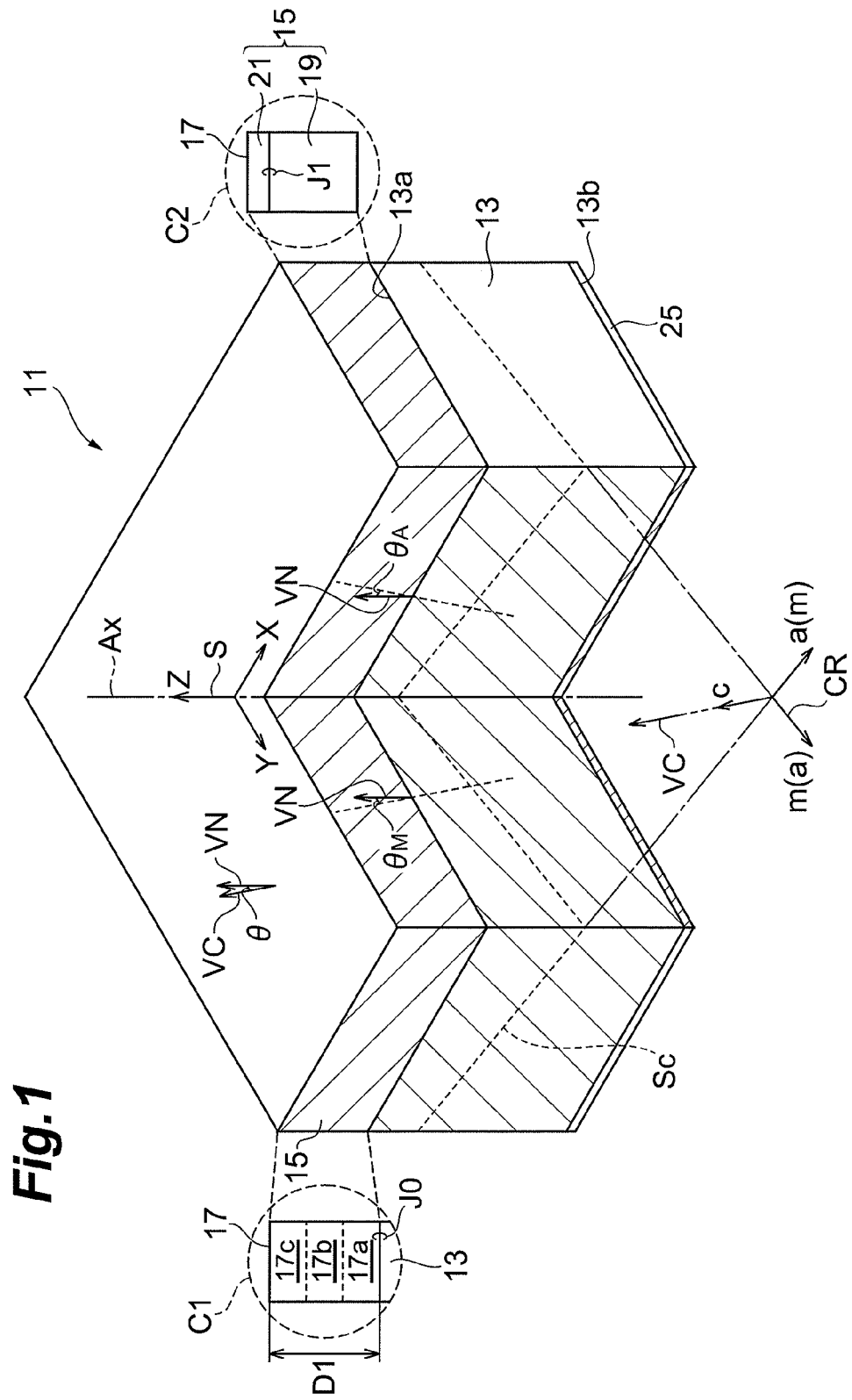
FIG. 1 is a drawing showing a multilayer structure of a III nitride semiconductor electronic device and an epitaxial wafer according to an embodiment of the present invention.

FIG. 1 is a drawing showing a lamination structure of a III nitride semiconductor electronic device and an epitaxial wafer according to an embodiment of the present invention. FIG. 1 shows an orthogonal coordinate system S indicating geometric directions and a crystal coordinate system CR indicating crystallographic orientations. In the crystal coordinate system CR, the a-axis, m-axis and c-axis of a III nitride semiconductor are orthogonal to each other.

A laminate 11 includes a substrate 13, and an epitaxial structure 15 comprised of a III nitride semiconductor. The substrate 13 will be referred to as a support base when it is prepared for a III nitride semiconductor electronic device, or will be referred to as a wafer when it is prepared for an epitaxial wafer. The substrate 13 and epitaxial structure 15 are arranged along a predetermined axis Ax. The substrate 13 comprises a III nitride semiconductor having a carrier concentration of more than $1 \times 10^{18}$ cm$^{-3}$, and this substrate 13 has electrical conductivity. This III nitride semiconductor can be, for example, a GaN or an AlN, or can be GaN, AN, or the like which is bonded to a support base. The substrate 13 has first and second faces 13a and 13b, and the first face 13a is located opposite to the second face 13b. The epitaxial structure 15 is provided on the first face 13a of the substrate 13. The epitaxial structure 15 can include a III nitride semiconductor epitaxial film or a plurality of III nitride semiconductor epitaxial films. An example of the epitaxial structure 15 is shown in a circular dashed line C1. The epitaxial structure 15 includes a III nitride semiconductor epitaxial film (hereinafter referred to as "epitaxial film") 17. A III nitride semiconductor of the epitaxial film 17 can be, for example, GaN, MN, Al$_X$Ga$_{1-X}$N, In$_X$Ga$_{1-X}$N, or, a mixed crystal of Al, In, Ga, and N, or the like. The epitaxial film 17 makes a junction J0 with the first face 13a of the substrate 13, and this junction can be a homojunction or a heterojunction, e.g., a junction such as GaN/GaN or GaN/Al$_X$Ga$_{1-X}$N. The first face 13a of the substrate 13 is inclined at an angle θ of more than 5 degrees with respect to an axis Cx that extends along the direction of the c-axis of the III nitride semiconductor. With reference to FIG. 1, there are shown a normal vector VN indicating a normal to the first face 13a and a c-axis vector VC indicating the direction of the c-axis of the III nitride semiconductor, and the normal vector VN and the c-axis vector VC forms an angle θ therebetween. The epitaxial film 17 includes first, second and third regions 17a, 17b and 17c arranged in order in the direction that is normal to the first face 13a. A dislocation density of the third region 17c is smaller than that of the first region 17a. A dislocation density of the second region 17b is smaller than that of the substrate 13.

A typical c-plane Sc is illustrated in order to indicate the inclination of the c-axis. The inclination angle θ in the present embodiment is defined by $(\theta_A^2 + \theta_M^2)^{1/2}$, using an angle $\theta_A$ of inclination of the c-axis defined with respect to the a-axis direction and an angle $\theta_M$ of inclination of the c-axis defined with respect to the m-axis direction. The substrate 13 and the epitaxial film 17 are arranged in the direction of the Z-axis and the first and second faces 13a, 13b of the substrate 13 spread in the directions of the X-axis and Y-axis. In an example, the first and second faces 13a, 13b are parallel to each other.

When the epitaxial film 17 for the electronic device is formed on the surface of the III nitride semiconductor inclined at the angle of more than 5 degrees with respect to the c-axis, decomposition/incorporation of dislocations occurs with progress in deposition of the III nitride semiconductor for the epitaxial film 17 by step flow growth, so as to reduce the dislocation density with progress of the growth. For this reason, the III nitride semiconductor is epitaxially grown whereby the first, second and third regions 17a, 17b and 17c are successively grown so that the dislocation density gradually decreases during the successive growth. As a result of this growth, the dislocation density of the third region 17c, which separated from the first region 17a by the second region 17b, becomes smaller than that of the first region 17a. The dislocation density of the second region 17b is smaller than that of the substrate 13.

In the epitaxial growth on the substrate 13, the epitaxial film 17 contains threading dislocations, and these threading dislocations are those inherited from the substrate 13. None of the conventional gallium nitride-based semiconductor electronic devices has a structure to bring out the technical contribution by the decomposition. However, when the thickness D1 of the epitaxial film 17 is at least 1 micrometer, not less than 3 micrometers for obtaining an outstanding effect, and according to Inventors' knowledge, the decomposition of threading dislocations can be effected by step flow growth in epitaxial growth.

The step flow growth of the III nitride semiconductor will be described with reference to FIG. 2. In the III nitride semiconductor deposition on a III nitride semiconductor region having an off angle of more than 5 degrees, semiconductor growth proceeds to some extent, so that a step-like morphology is formed in the growth surface, as shown in FIG. 2(a). The shape and plane orientation of steps are dependent on a direction $A_{OFF}$ of the off angle. When an appropriate growth condition is maintained, the step-like morphology always appears in the grown surface.

The III nitride semiconductor is homo-grown on III nitride semiconductor substrates with primary surfaces of different off angles, and the following fact is found by observation of the experiment result in the growth on the primary surfaces with the off angle of more than 5 degrees. As shown in FIG. 2 (a), low-dislocation regions A1 having a low dislocation density and high-dislocation regions A2 having a high dislocation density are formed in the III nitride semiconductor. Threading dislocations TD1 are shown in a low-dislocation region A1, and threading dislocations TD2 are shown in a high-dislocation region A2.

Figure 2:
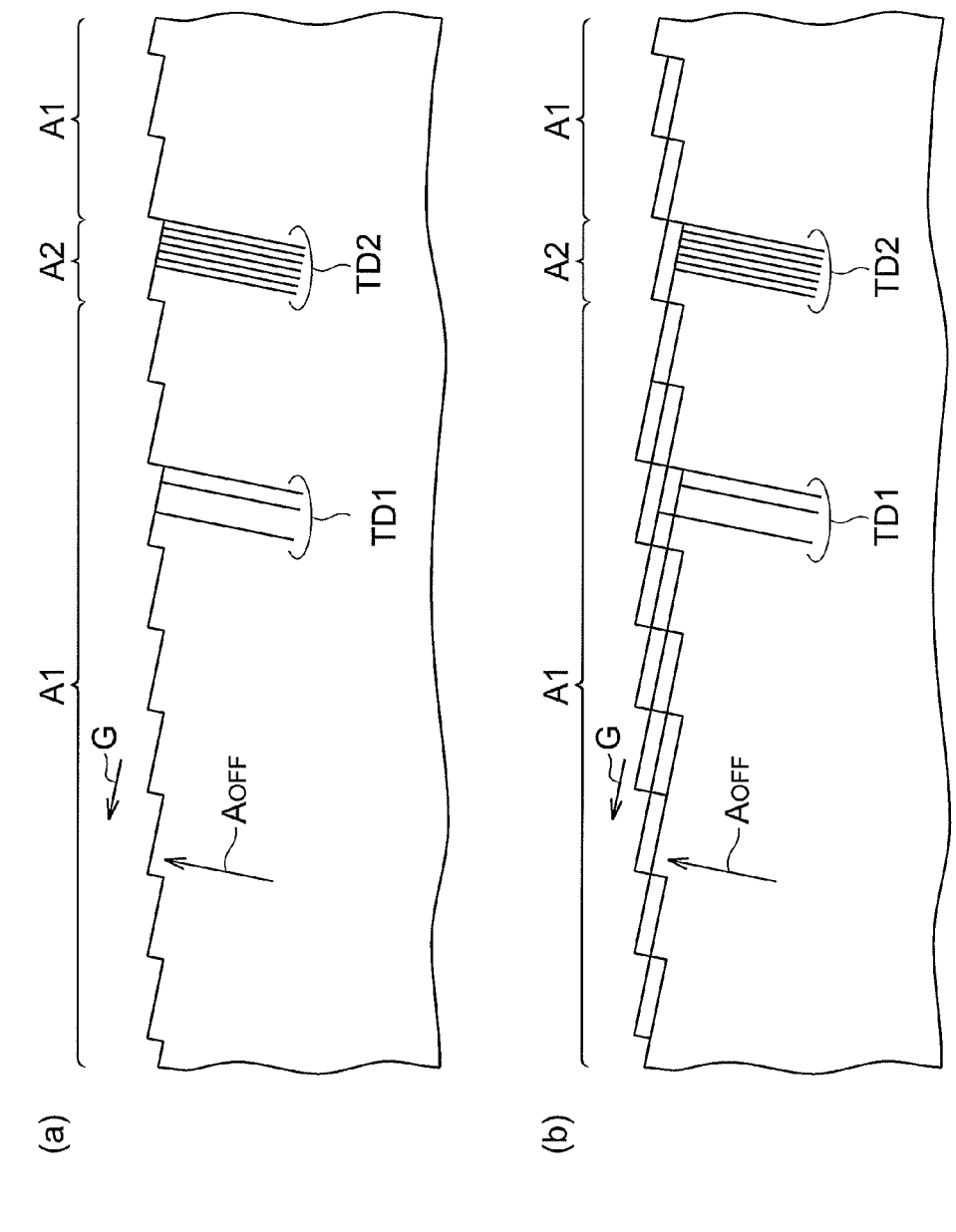
FIG. 2 is a drawing for explaining step flow growth of III nitride.

As shown in FIG. 2 (b), in the low-dislocation regions A1, the step flow growth proceeds in a direction indicated by arrow G with little influence of the threading dislocations. Then, the threading dislocations incorporate with each other to annihilate. On the other hand, the progress of the step flow growth is slow in the high-dislocation regions A2. For this reason, the step growth develops from the low-dislocation regions, so that the high-dislocation regions where the progress of the step flow growth is slow are buried thereby.

FIG. 3 (a) and FIG. 3 (b) are figures schematically showing decomposition of a threading dislocation. The decomposition of threading dislocation permits dislocations to be spatially dispersed while avoiding local concentration of dislocations. By the decomposition of threading dislocation, a dislocation of a large Burgers vector B1 is decomposed into dislocations of smaller Burgers vectors B2 and B3. This can reduce local strain in the crystal. FIG. 4 (a) and FIG. 4 (b) are figures schematically showing incorporation of threading dislocations. By the incorporation of threading dislocations, the frequency of incorporation of dislocations increases on the contrary, and this incorporation can decrease the dislocation density, and can make the Burgers vectors of dislocations smaller. By the incorporation of threading dislocations, dislocations of Burgers vectors B4 and B5, which are opposite to each other, incorporate with each other, thereby generating a dislocation of a smaller Burgers vector B6. This can also reduce local strain in the crystal.

In this way, the decomposition/incorporation of threading dislocations is effective in provision of the III nitride semiconductor electronic device making use of crystals with excellent quality, the method of fabricating the III nitride semiconductor electronic device, and the epitaxial wafer for the III nitride semiconductor electronic device. Accordingly, the leakage current is remarkably reduced in a Schottky junction or a pn junction made in this lamination structure, thereby improving the breakdown voltage of the electronic device.

As understood from FIG. 2, a facet is formed in the high-dislocation region A2 where the step flow growth is slow, but the area of the facet in the surface of the III nitride semiconductor decreases with increase in off angle, thereby enhancing the device yield. With increase in off angle, the number of steps appearing in the surface increases and terraces of the steps become smaller. For this reason, the steps develop before nucleation on the terrace faces, and thus each threading dislocation is decomposed into a plurality of threading dislocations arranged in the developing direction of the steps. A facet is made in a region of a high dislocation density, but spread of the facet is restricted on a primary surface having a large off angle.

The surface of the epitaxial film 17 has a morphology which includes steps each having a plurality of crystal planes as shown in FIG. 2(b). Since the surface of the epitaxial film 17 indicates the final stage of the growth of the epitaxial film 17, the appearance of the foregoing morphology on the surface of the epitaxial film 17 indicates that the decomposition of dislocation occurs in good order in the epitaxial film 17. This leads to reduction in local strain due to the dislocations in the epitaxial film 17.

The first face 13a of the substrate 13 can be inclined at the angle θ of not less than 20 degrees with respect to the reference axis Ax. When the inclination angle θ is not less than 20 degrees, the steps become finer and the decompositions of dislocation occur in good order in the epitaxial film 17. As a consequence, the local strain due to the dislocations in the epitaxial film 17 is reduced. Furthermore, the first face 13a of the substrate 13 can be inclined at the angle θ in the range of not less than 40 degrees and not more than 80 degrees with respect to the reference axis Ax. When the inclination angle θ is not less than 40 degrees, the step density becomes larger and the decompositions of dislocation favorably occur in the epitaxial film 17. Furthermore, when the inclination angle θ is not more than 80 degrees, inclination of the first face 13a from the a-plane and m-plane can prevent the step density from becoming smaller. As a consequence, the local strain due to the dislocations in the epitaxial film 17 is reduced.

The thickness D1 of the epitaxial film 17 can be not less than 3 micrometers. The reduction of dislocations makes it feasible to provide the electronic device with a desired reverse breakdown voltage. A carrier concentration $N_C$ of the epitaxial film 17 can be not less than $1 \times 10^{14}$ cm$^{-3}$. The carrier concentration $N_C$ can be not more than $1 \times 10^{17}$ cm$^{-3}$. The carrier concentration makes it feasible to provide the electronic device with a desired reverse breakdown voltage.

When the thickness D1 of the epitaxial film 17 is not less than 5 micrometers, the dislocation density of the surface layer of the device is reduced by the decomposition of dislocation. The carrier concentration $N_C$ can be not less than $1 \times 10^{14}$ cm$^{-3}$. The carrier concentration $N_C$ can be not more than $2 \times 10^{16}$ cm$^{-3}$. In growth of a high-purity crystal of not more than $2 \times 10^{16}$ cm$^{-3}$, the density of impurity atoms adhering to the surface during the growth is also low, and therefore such impurity atoms do not impede surface migration of crystal constituent atoms (Ga and N) for the step flow growth, thereby promoting the growth of the high-quality crystal.

If the thickness D1 of the epitaxial film 17 becomes more than 100 micrometers, the film will become more susceptible to increase of crystal defects due to long-haul crystal growth, rather than the effect of reduction in dislocations.

Referring again to FIG. 1, another example of the epitaxial structure 15 is shown in a circular dashed line C2. The epitaxial film 17 includes a first conductivity type III nitride semiconductor layer 19 and a second conductivity type III nitride semiconductor layer 21. The first conductivity type III nitride semiconductor layer 19 and the second conductivity type III nitride semiconductor layer 21 form a pn junction J1. This pn junction J1 can be a homojunction. In the electronic device with formation of this pn junction, the technical contribution by the decomposition/incorporation of dislocations can be achieved.

Each of the first conductivity type III nitride semiconductor layer 19 and the second conductivity type III nitride semiconductor layer 21 can include first, second and third regions 13c arranged in order in the direction normal to the first face 13a. The dislocation density of the third region is smaller than that of the first region. In each of the first conductivity type III nitride semiconductor layer 19 and the first conductivity type III nitride semiconductor layer 21, the dislocation density can also be reduced by the decomposition of dislocation.

(Schottky Diode)

Figure 5:
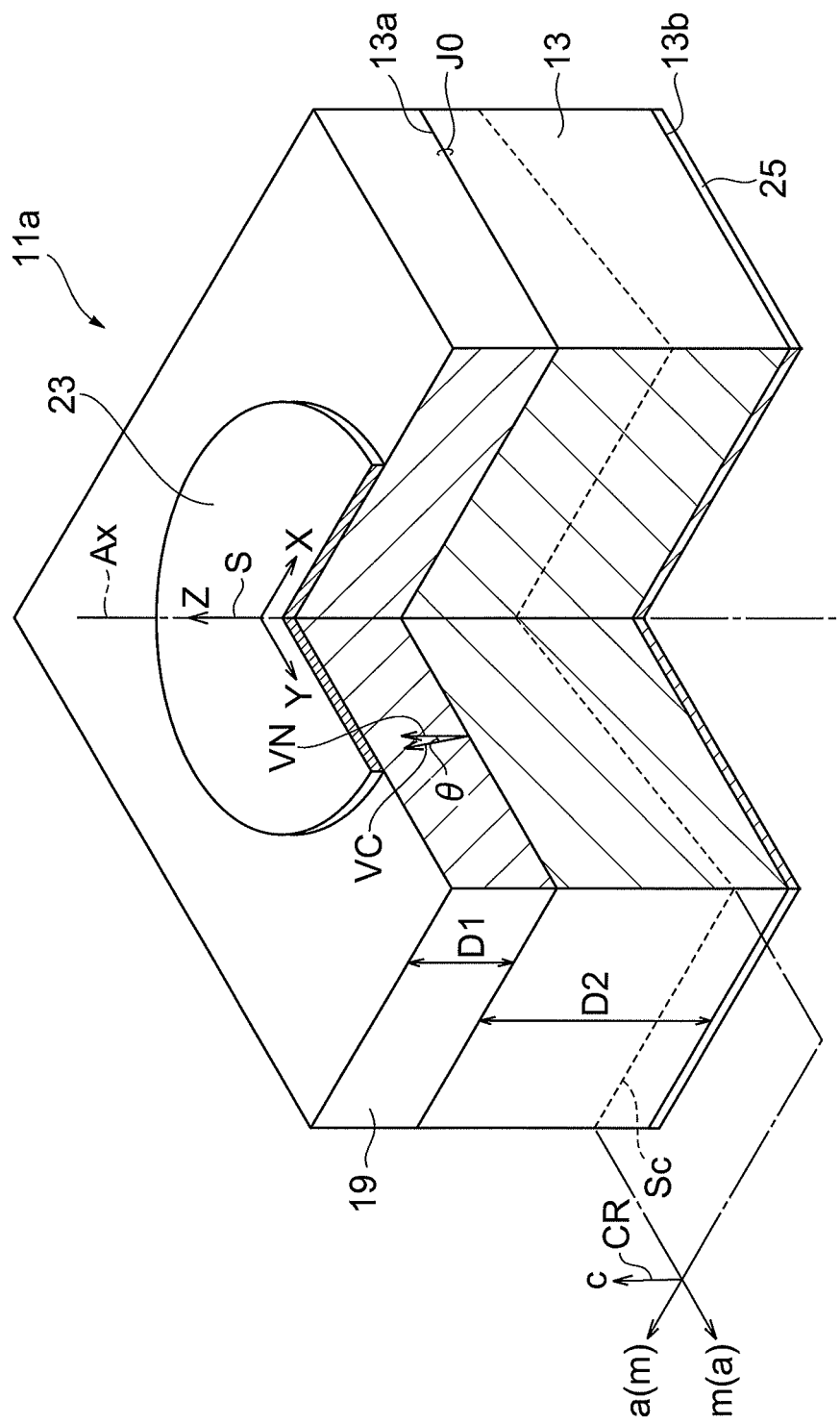
FIG. 5 is a drawing showing a Schottky diode according to an embodiment of the present invention.

An electronic device 11a, as shown in FIG. 5, can further include a Schottky electrode 23 and an ohmic electrode 25. The Schottky electrode 23 forms a Schottky junction with the first conductivity type III nitride semiconductor layer 19. The ohmic electrode 25 forms an ohmic contact with the second face 13b of the substrate 13. The electronic device 11a can be, for example, a Schottky diode.

The thickness D1 of the first conductivity type III nitride semiconductor layer 19 is not less than 3 micrometers and not more than 100 micrometers. The carrier concentration of the first conductivity type III nitride semiconductor layer 19 is not less than $1 \times 10^{14}$ cm$^{-3}$ and not more than $1 \times 10^{17}$ cm$^{-3}$. When the carrier concentration of the substrate 13 is not less than $1 \times 10^{18}$ cm$^{-3}$ and not less than $1 \times 10^{14}$ cm$^{-3}$, the on-resistance of the diode can be decreased. When the off angle θ of the substrate 13 is larger than 5 degrees and the carrier concentration is not more than $1 \times 10^{17}$ cm$^{-3}$, desirably not more than $2 \times 10^{16}$ cm$^{-3}$, the above off angle θ and the above carrier concentration can suppress the leakage current to determine the breakdown voltage.

In this Schottky diode 11a, the step flow growth is promoted because the substrate 13 has the off angle θ of more than 5 degrees with respect to the c-axis direction, so that dislocations with large strain in the substrate 13, i.e., dislocations of large Burgers vectors are decomposed into plural dislocations each with smaller strain or smaller Burgers vectors.

The threading dislocations move while directions of dislocations are turned into the off direction of the substrate 13. When the thickness of the nitride semiconductor layer 19 is not less than about 3 micrometers, a dislocation moving during the epitaxial growth has a number of opportunities to collide with another dislocation of an opposite Burgers vector such that these dislocations annihilate. The collision of dislocations decreases the dislocation density. Furthermore, since the carrier concentration of the nitride semiconductor layer 19 is not less than $1 \times 10^{14}$ cm$^{-3}$ and not more than $1 \times 10^{17}$ cm$^{-3}$, appropriate design of the thickness and carrier concentration of the nitride semiconductor layer 19 can realize increase in the breakdown voltage by reducing the leakage current, and a low on-resistance.

As shown in FIG. 5, the carrier concentration of the substrate 13 is larger than that of the epitaxial layer. The ohmic electrode 25 is provided throughout the entire area of the second face 13b of the substrate 13. The Schottky electrode 23 is formed in a part of the surface of the first conductivity type III nitride semiconductor layer 19, e.g., an electrode of a disk shape is formed in a nearly central region of the diode device. For example, nickel/gold (Ni/Au) can be used for the Schottky electrode 23. Besides this example, it is also possible to use Pt/Au or Au. The substrate 13 and the first conductivity type III nitride semiconductor layer 19 have the n-conductivity type. The first conductivity type III nitride semiconductor layer 19 is homo-epitaxially grown directly on the substrate 13. The thickness D2 of the substrate 13 is, for example, not less than 50 micrometers and the thickness D2 is not more than 700 micrometers.

EXPERIMENT EXAMPLE 1

Prepared is a GaN free-standing substrate with a primary surface inclined at the off angle of 5.5 degrees with respect to the (0001) plane. This GaN free-standing substrate is produced by a HVPE method and the thickness thereof is 400 micrometers. The GaN free-standing substrate exhibits the n-conductivity type, and the carrier concentration thereof is $3 \times 10^{18}$ cm$^{-3}$. An average dislocation density in this GaN substrate is $5 \times 10^{6}$ cm$^{-2}$. A Schottky diode is produced on the GaN free-standing substrate in accordance with the following procedure. An n-conductivity type GaN epitaxial film is grown on the GaN free-standing substrate by a metal-organic chemical vapor deposition (MOCVD) method to produce an epitaxial wafer. This GaN epitaxial film has a carrier concentration of $5 \times 10^{15}$ cm$^{-3}$ and a thickness of 3 micrometers. An ohmic electrode is formed on the back side of the epitaxial wafer and a Schottky electrode is formed on the epitaxial film. After organic cleaning of the wafer, the ohmic electrode is formed throughout the entire area of the back side of the epitaxial wafer. The ohmic electrode is formed by EB evaporation. The ohmic electrode is made of Ti/Al/Ti/Au (20 nm/100 nm/20 nm/300 nm). After formation of the ohmic electrode film, an alloy process is carried out. This process is, for example, a thermal treatment at 600 Celsius degrees for about one minute. The Schottky electrode is formed by electron beam evaporation. The Schottky electrode is made of Ni/Au. The shape of the Schottky electrode is, for example, a disk shape with the diameter of 200 micrometers. Prior to formation of each of the ohmic electrode and the Schottky electrode, the surface of the epitaxial film is treated at room temperature with an HCl aqueous solution (hydrochloric acid 1: pure water 9, which is a ratio by volume) before the evaporation, and a treatment time is one minute. This Schottky diode will be referred to hereinafter as device A.

Figure 6:
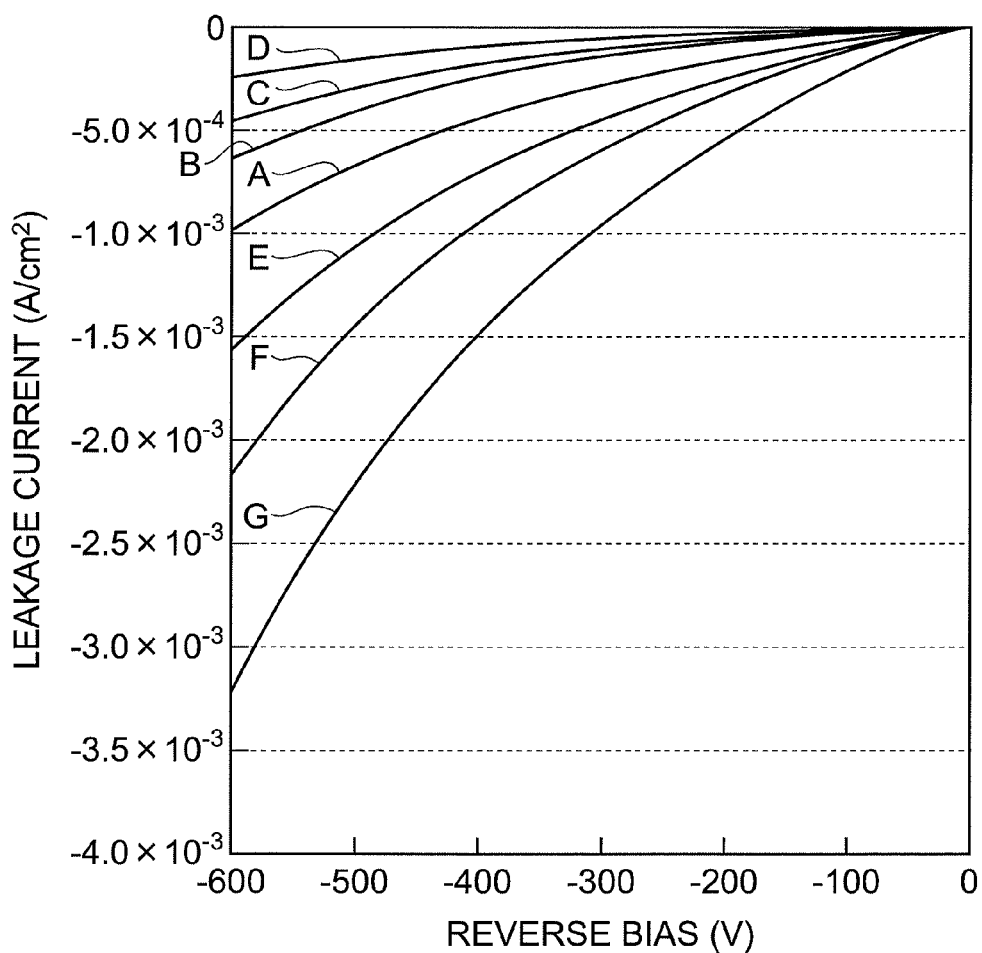
FIG. 6 is a drawing showing I-V reverse bias characteristics of device A.

FIG. 6 is a drawing showing I-V reverse bias characteristics of the device A. Curve A indicates the characteristics of device A. When the reverse bias of 600 V is applied to the device A, the leakage current density of device A is $1\times10^{-3}$ A/cm$^2$, and device A demonstrates a sufficiently large reverse breakdown voltage. Furthermore, the on-resistance of device A is 0.9 mΩcm$^2$ and this value is sufficiently low.

EXPERIMENT EXAMPLE 2

Prepared is a GaN free-standing substrate with the off angle of 25 degrees from the (0001) plane. The GaN free-standing substrate is produced by a HVPE method. A Schottky diode is produced by the same procedure as in Experiment Example 1. This Schottky diode will be referred to hereinafter as device B.

Curve B in FIG. 6 indicates the characteristics of device B. When the reverse bias of 600 V is applied to device B, the leakage current density of device B is $7\times10^{-4}$ A/cm$^2$, and device B demonstrates a sufficiently large reverse breakdown voltage. Furthermore, the on-resistance of device B is 0.9 mΩcm$^2$ and this value is sufficiently low.

EXPERIMENT EXAMPLE 3

Prepared is a GaN free-standing substrate with the off angle of 54 degrees with respect to the (0001) plane produced by a HVPE method. The GaN free-standing substrate is produced by a HVPE method and the thickness thereof is 400 micrometers. The GaN free-standing substrate exhibits the n-conductivity type, and the carrier concentration thereof is $5\times10^{18}$ cm$^{-3}$. The average dislocation density in this GaN substrate is $5\times10^{8}$ cm$^{-2}$. A Schottky diode is produced by the same procedure as in Experiment Example 1. An n-conductivity type GaN epitaxial film is grown on the GaN free-standing substrate by a MOCVD method to produce an epitaxial wafer. This GaN epitaxial film has a carrier concentration of $5\times10^{15}$ cm$^{-3}$ and a thickness of 3 micrometers. This Schottky diode will be referred to hereinafter as device C.

Curve C in FIG. 6 indicates the characteristics of device C. When the reverse bias of 600 V is applied to device C, the leakage current density of device C is $5\times10^{-4}$ A/cm$^2$ and device C exhibits a sufficiently large reverse breakdown voltage. Furthermore, the on-resistance of device C is 0.8 mΩcm$^2$ and this value is sufficiently low.

A diode formed in a region of high dislocation density of the GaN free-standing substrate also demonstrates the leakage current at the same level. This indicates that the region of a high dislocation density is modified by the step flow growth. The rate of crystal growth on the region of a high dislocation density is smaller than that on regions of low dislocation density, and it is considered that a crystal by the step flow growth covers at least a part of the region of a high dislocation density.

EXPERIMENT EXAMPLE 4

Prepared is a GaN free-standing substrate with the off angle of 7 degrees with respect to the (0001) plane. This GaN free-standing substrate is produced by a HVPE method and the thickness thereof is 400 micrometers. The GaN free-standing substrate has the n-conductivity type and a carrier concentration thereof is $3\times10^{18}$ cm$^{-3}$. The average dislocation density in this GaN substrate is $5\times10^{6}$ cm$^{-2}$. A Schottky diode is produced according to the following procedure. An n-conductivity type GaN epitaxial film is grown on the GaN free-standing substrate by a MOCVD method to produce an epitaxial wafer. This GaN epitaxial film has a carrier concentration of $5\times10^{15}$ cm$^{-3}$ and a thickness of 5 micrometers. This Schottky diode will be referred to hereinafter as device D.

Curve D in FIG. 6 indicates the characteristics of device D. When the reverse bias of 600 V is applied to device D, the leakage current density of device D is $2\times10^{-4}$ A/cm$^2$. By increasing the thickness of the GaN epitaxial film, a sufficient reverse breakdown voltage is obtained.

EXPERIMENT EXAMPLE 5

Prepared is a GaN free-standing substrate with the off angle of 4.5 degrees from the (0001) plane produced by a HVPE method. A Schottky diode is produced according to the same procedure as in Experiment Example 1. This Schottky diode will be referred to hereinafter as device E. Curve E in FIG. 6 indicates the characteristics of device E. When the reverse bias of 600 V is applied to device E, the leakage current density of device E is over $1.5\times10^{-3}$ A/cm$^2$.

EXPERIMENT EXAMPLE 6

Prepared was a GaN free-standing substrate with the off angle of 7 degrees with respect to the (0001) plane. This GaN free-standing substrate is produced by a HVPE method. The characteristics of the GaN substrate are the same as those in Experiment Example 1, except that the average dislocation density of the GaN substrate is $5\times10^{8}$ cm$^{-2}$. A Schottky diode is produced according to the following procedure. This Schottky diode will be referred to hereinafter as device F. Curve F in FIG. 6 indicates the characteristics of device F. When the reverse bias of 600 V is applied to device F, the leakage current density of device E is over $2\times10^{-3}$ A/cm$^2$. Although the original dislocation density is high, reduction in dislocation density is achieved by the decomposition of dislocation.

EXPERIMENT EXAMPLE 7

Prepared is a GaN free-standing substrate with the off angle of 4.5 degrees with respect to the (0001) plane. This GaN free-standing substrate is produced by a HVPE method. The characteristics of the GaN substrate are the same as those in Experiment Example 1, except for the off angle of the GaN substrate. A Schottky diode is produced according to the following procedure. The Schottky diode is produced on a GaN region with a high dislocation density. This Schottky diode will be referred to hereinafter as device G Curve G in FIG. 6 indicates the characteristics of device G. When the reverse bias of 600 V is applied to device G, the leakage current density of device E is large. The epitaxial film on the GaN region with the small off angle and with the high dislocation density is not modified by the step flow growth, thereby resulting in the large leakage current.

(PN Junction Diode)

Figure 7:
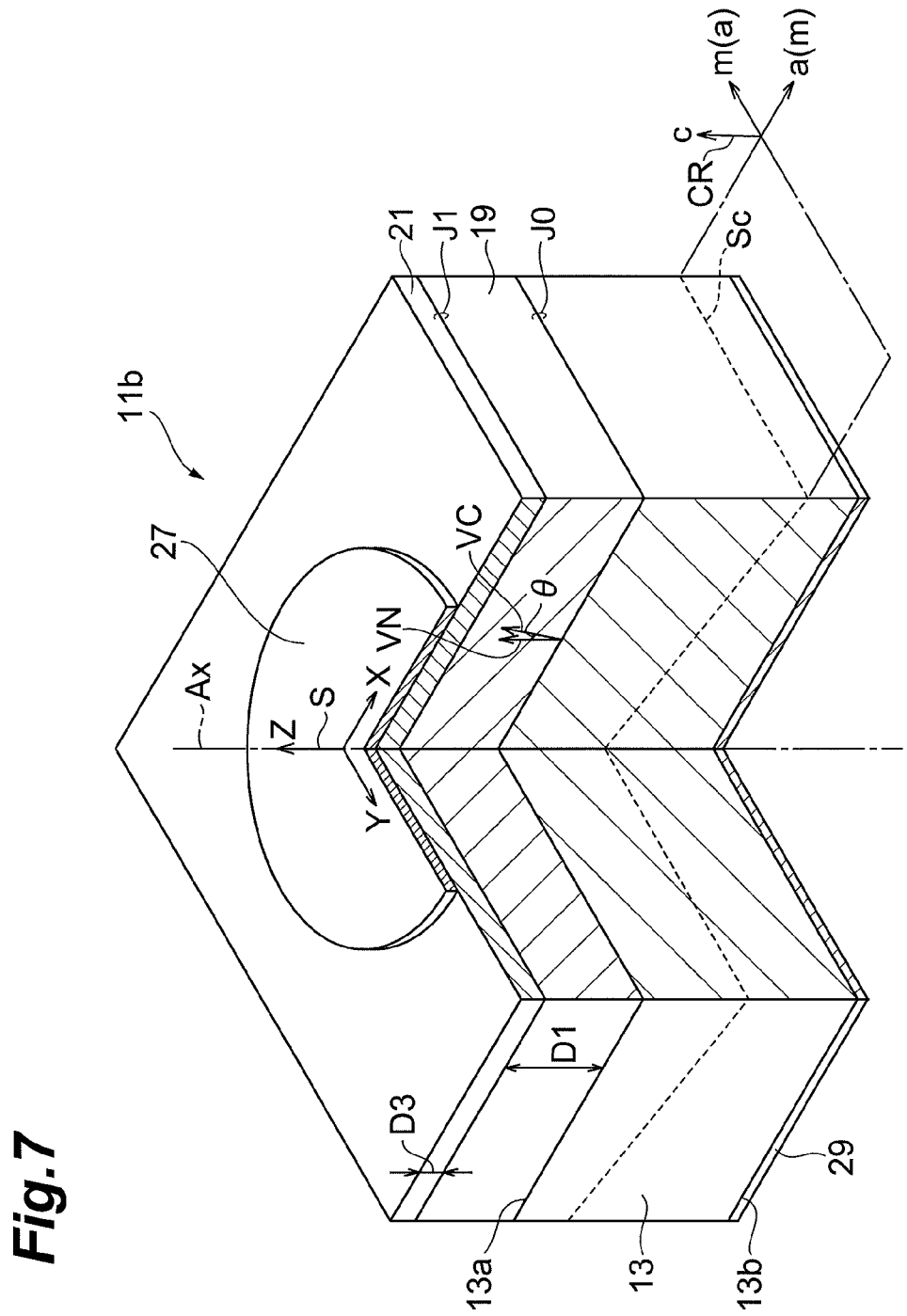
FIG. 7 is a drawing showing a pn junction diode according to an embodiment of the present invention.

An electronic device 11b, as shown in FIG. 7, can further include a first ohmic electrode 27 and a second ohmic electrode 29. The ohmic electrode 27 makes an ohmic junction with the second conductivity type III nitride semiconductor layer 21. The ohmic electrode 29 makes an ohmic contact with the second face 13b of the substrate 13. The electronic device 11b can be, for example, a pn junction diode.

The carrier concentration of the substrate 13 is larger than that of the first conductivity type III nitride semiconductor layer 19, and the ohmic electrode 29 is provided throughout the entire area of the second face 13b of the substrate 13. The ohmic electrode 27 is formed in a part of the surface of the second conductivity type III nitride semiconductor layer 21, e.g., an ohmic electrode of a disk shape is formed in a nearly central region of the diode device. In this pn junction diode 11b, the ohmic electrode 29 is, for example, a cathode and the ohmic electrode 27, for example, an anode. Materials of the cathode electrode applicable herein are, for example, Ti/Al/Ti/Au (20 nm/100 nm/20 nm/300 nm) and materials of the anode electrode applicable herein are, for example, Ni/Au (50 nm/100 nm). The first conductivity type III nitride semiconductor layer 19 is homo-epitaxially grown directly on the substrate 11, and the second conductivity type III nitride semiconductor layer 21 is homo-epitaxially grown directly on the first conductivity type III nitride semiconductor layer 19.

The thickness D1 of the first conductivity type III nitride semiconductor layer 19 is larger than the thickness D3 of the second conductivity type III nitride semiconductor layer 21. The dislocation density of the surface layer of the first conductivity type III nitride semiconductor layer 19 is reduced with the growth of the first conductivity type III nitride semiconductor layer 19, and the second conductivity type III nitride semiconductor layer 21 can be grown on this first conductivity type III nitride semiconductor layer 19. For this reason, the pn junction is located in a low-dislocation III nitride semiconductor region. The thickness D3 of the second conductivity type III nitride semiconductor layer 21 can be, for example, not less than 0.1 micrometer and not more than 10 micrometers. For achieving some breakdown voltage, a drift layer needs to be a layer with a low carrier concentration so that a depletion layer can extend by a thickness corresponding to the breakdown voltage, and the drift layer needs to be an n-type layer with a high mobility for achieving a low on-resistance in a low carrier concentration. On the other hand, since a p-type layer can be a layer with a high carrier concentration, the sufficient thickness thereof is not less than 0.1 micrometer. If it is too thick on the contrary, the on-resistance will increase, which is inadequate.

In this pn junction diode, the thickness D1 of the first conductivity type III nitride semiconductor layer 19 can be not less than 3 micrometers and not more than 100 micrometers, and the carrier concentration of the first conductivity type III nitride semiconductor layer 19 can be not less than $1 \times 10^{14}$ cm$^{-3}$ and not more than $1 \times 10^{17}$ cm$^{-3}$. When the carrier concentration of the substrate 13 is not less than $1 \times 10^{18}$ cm$^{-3}$ and the carrier concentration of the epitaxial region having the III nitride semiconductor layer 19 is not less than $1 \times 10^{14}$ cm$^{-3}$, the on-resistance of the pn junction diode can be reduced. When the off angle of the substrate is larger than 5 degrees and the carrier concentration is not more than $1 \times 10^{17}$ cm$^{-3}$, the leakage current of the pn junction diode is suppressed to improve the breakdown voltage.

The substrate 13 and the first conductivity type III nitride semiconductor layer 19 exhibit, for example, the n-type, and the second conductivity type III nitride semiconductor layer 21 exhibits, for example, the p-type. The carrier concentration of the substrate 13 is larger than that of the first conductivity type III nitride semiconductor layer 19. The carrier concentration of the first conductivity type III nitride semiconductor layer 19 is smaller than that of the second conductivity type III nitride semiconductor layer 21. Accordingly, a depletion layer in the pn junction is generated mainly in the first conductivity type III nitride semiconductor layer 19. The thickness D1 and carrier concentration of the first conductivity type III nitride semiconductor layer 19 can be the same as those in the Schottky diode 11a, respectively. The carrier concentration of the second conductivity type III nitride semiconductor layer 21 can be not less than $1 \times 10^{16}$ cm$^{-3}$.

In this pn junction diode, since the substrate 13 has the off angle θ of more than 5 degrees from the c-axis direction, the step flow growth is promoted in the growth of the first conductivity type III nitride semiconductor layer 19 and the second conductivity type III nitride semiconductor layer 21. For this reason, dislocations with great strain in the substrate 13, i.e., dislocations with large Burgers vectors are decomposed into dislocations with smaller strain, i.e., a plurality of dislocations each with smaller Burgers vectors.

Furthermore, threading dislocations move while the directions of dislocations are turned into the off direction of the substrate 13. When the total thickness of the first conductivity type III nitride semiconductor layer 19 and the second conductivity type III nitride semiconductor layer 21 is not less than about 3 micrometers, some of dislocations moving during the epitaxial growth come to collide with dislocations of opposite Burgers vectors to annihilate. The collision of dislocations decreases the dislocation density. The dislocation density can also be reduced by the decomposition of dislocation in each of the first conductivity type III nitride semiconductor layer 19 and the second conductivity type III nitride semiconductor layer 21.

Furthermore, since the carrier concentration of the nitride semiconductor layer 19 is not less than $1 \times 10^{14}$ cm$^{-3}$ and not more than $1 \times 10^{17}$ cm$^{-3}$, the breakdown voltage can be enhanced by reducing the leakage current while realizing a low on-resistance, by appropriate design of the thickness and carrier concentration of the nitride semiconductor layer 19.

EXPERIMENT EXAMPLE 8

Prepared is an n-conductivity type GaN free-standing substrate produced by a HVPE method. The off angle of the primary surface of this GaN free-standing substrate was 54 degrees. The carrier concentration of this GaN free-standing substrate is $3 \times 10^{18}$ cm$^{-3}$ and the thickness thereof is 400 micrometers. The dislocation density of the GaN free-standing substrate is $5 \times 10^5$ cm$^{-3}$. On the GaN free-standing substrate, an n-conductivity type GaN epitaxial film is grown by a MOCVD method, and a p-conductivity type GaN epitaxial layer is grown subsequent to the foregoing growth, thereby producing an epitaxial wafer with a pn junction. The carrier concentration of this n-conductivity type GaN film is $8 \times 10^{15}$ cm$^{-3}$, and the thickness thereof is 5 micrometers. The p-conductivity type GaN film is doped with Mg as a dopant in the concentration of $1 \times 10^{19}$ cm$^{-3}$. The thickness D3 of the p-conductivity type GaN film is 3 micrometers. The carrier concentration of the p-conductivity type GaN film is $5 \times 10^{17}$ cm$^{-3}$.

The surface of the p-conductivity type GaN layer is dry-etched by Cl$_2$-based reactive ion etching (RIE) to form a mesa in the height of about 2 micrometers. Thereafter, Ni/Au (50 nm/100 nm) metals are vacuum-evaporated by the resistance heating method to form a p-type ohmic electrode on the mesa. The shape of the p-type electrode is, for example, a disk shape with the diameter of 200 micrometers. Ti/Al/Ti/Au (20 nm/100 nm/20 nm/300 nm) metals are evaporated over the entire area of the back side of the substrate by the EB vacuum method to form an n-type ohmic electrode. When needed, alloying is effected for the electrodes.

The leakage current density of this pn junction diode is $1 \times 10^{-4}$ A/cm$^2$ with application of the reverse bias of 600 V, thus exhibiting a low leakage current property.

(MIS Type Device)

FIG. 8 is a drawing showing a structure of a III nitride semiconductor MIS type transistor, in which FIG. 8 (b) is a drawing showing a cross section taken along the line II-II shown in FIG. 8 (a). The MIS type field effect transistor 71 comprises a substrate 13, a III nitride semiconductor epitaxial film 17, a low-doped separation region 57, a high-doped source semiconductor region 59, a source electrode 61, a drain electrode 63, and a gate electrode 75. The substrate 13 has the carrier concentration of more than $1 \times 10^{18}$ cm$^{-3}$.

The epitaxial film 17 is provided on the first face 13a. The separation region 57 is made, for example, of a p-type semiconductor and is provided in the epitaxial film 17. The source semiconductor region 59 is made, for example, of an n-type semiconductor and is provided in the separation region 57 of the opposite conductivity type to the source semiconductor region 59. The source semiconductor region 59 is separated from the epitaxial film 17 by the separation region 57 provided between the source semiconductor region 59 and the epitaxial film 17. The source electrode 61 is provided on the source semiconductor region 59. The drain electrode 63 is provided on the second face 13b. The gate electrode 75 is provided on an insulating layer 77 formed on the epitaxial film 17. The separation region 57 has extension portions 57a located immediately below the source semiconductor region 59, and channel portions 57b located below the gate electrode 75. The gate electrode 75 changes the potential on the surface of the separation region 57. Materials for the insulating layer applicable herein include silicon oxide film, silicon oxynitride film, silicon nitride film, alumina, aluminum nitride, AlGaN, and so on. The thickness of the epitaxial film 17 is not less than 3 micrometers and not more than 100 micrometers, and the carrier concentration of the epitaxial film 17 is not less than $1 \times 10^{14}$ cm$^{-3}$ and not more than $1 \times 10^{17}$ cm$^{-3}$.

This transistor 71 has the vertical structure in which electric current flows from one of the source electrode 61 provided on the source semiconductor region 59 and the drain electrode 63 provided on the second face 13b of the substrate 13 to the other. The thickness of the epitaxial film 17 is not less than 3 micrometers and not more than 100 micrometers, and the carrier concentration of the epitaxial film 17 is not less than $1 \times 10^{14}$ cm$^{-3}$ and not more than $1 \times 10^{17}$ cm$^{-3}$.

When the separation region of the p-type semiconductor is formed by ion implantation, the semiconductor device can be formed in a planar structure with the p-conductivity type semiconductor in the selected region. The p-type dopant can be, for example, magnesium or the like. Alternatively, the separation region of the p-type semiconductor can be formed by the selective epitaxial process based on the metal-organic vapor phase epitaxial process. With an insulating film mask of SiO$_2$ or SiN$_X$, a groove is formed by dry etching with chlorine-based gas or the like, and thereafter a p-type epitaxial region is selectively grown in this groove by a metal-organic vapor phase epitaxial method. Then, an n-type semiconductor region is formed by ion implantation inside the p-type epitaxial region. The semiconductor device can be formed in the planar structure through the foregoing steps.

This semiconductor device has the n-conductivity type semiconductor separated from the epitaxial film 17 by the p-type epitaxial region. The n-type dopant can be, for example, silicon or the like. The separation region 57 electrically isolates the source semiconductor region 59 from the III nitride semiconductor epitaxial film 17. When a voltage is applied to the gate electrode 75, an n-type inversion layer is formed at an interface between the insulating film and the p-type region 57b, and carriers flow through the inversion layer from the source semiconductor region 59 into the epitaxial film 17. The depth of the separation region 57 can be not less than 0.1 micrometer and not more than 3 micrometers. The carrier concentration of the surface part of the separation region 57 can be not less than $1 \times 10^{17}$ cm$^{-3}$. The depth of the source semiconductor region 59 can be not less than 0.05 micrometer and not more than 2 micrometers. The carrier concentration of the source semiconductor region 59 can be not less than $5 \times 10^{17}$ cm$^{-3}$. As shown in FIG. 8 (a), each of branches 75a of the gate electrode 75 is located between branches 61a of the source electrode 61. Corners of each electrode 75, 61 are rounded in order to prevent smaller breakdown.

When a reverse bias is applied to this transistor, a depletion layer is formed in the epitaxial film 17. Therefore, for the same reason as in the case of the Schottky diode and the pn junction diode described previously, the MIS type transistor of the foregoing structure can also achieve reduction in leakage current density by decrease of threading dislocation density in the III nitride semiconductor epitaxial film 17. As a consequence of this, the reverse breakdown voltage of the MIS type transistor is improved.

(Method of Fabricating Epitaxial Substrate and Method of Fabricating III Nitride Semiconductor Electronic Device)

FIGS. 9 (a) to (c) are figures showing major steps in a method for fabricating an epitaxial substrate and a III nitride semiconductor electronic device. As shown in FIG. 9 (a), a III nitride semiconductor free-standing substrate (hereinafter referred to as "free-standing substrate") 83 is prepared. A maximum distance between two points on an edge of this free-standing substrate 83 is, for example, 45 mm or more (e.g., 2-inch wafer). A primary surface of this free-standing substrate 83 has the off angle of more than 5 degrees with respect to the (0001) plane of the III nitride semiconductor.

The free-standing substrate 83 has the carrier concentration of more than $1 \times 10^{18}$ cm$^{-3}$. As shown in FIG. 9 (b), a III nitride semiconductor epitaxial film (hereinafter referred to as "epitaxial film") 85 is deposited on a first face 83a of the free-standing substrate 83 in a growth reactor 10. The thickness D1 of the epitaxial film 85 is not less than 3 micrometers and not more than 100 micrometers. The epitaxial film 85 exhibits, for example, the n-conductivity type, and the carrier concentration thereof is not less than $1 \times 10^{14}$ cm$^{-3}$ and not more than $1 \times 10^{17}$ cm$^{-3}$. This provides an epitaxial wafer 81. An electronic device such as a Schottky diode or an MIS type transistor can be fabricated by carrying out a step of forming electrodes on this wafer 81. The epitaxial film 85 is preferably grown by a HVPE method. The HVPE method permits growth of an epitaxial film with a large film thickness for the epitaxial film 85 in a short time. Alternatively, a metal-organic vapor phase epitaxial method can be adopted to grow the epitaxial film 85 with excellent in-plane uniformity.

Next, as shown in FIG. 9 (c), a Schottky electrode film 87 is formed on the surface of the epitaxial film 85 of this epitaxial wafer 8,1 and an ohmic electrode film 89 is formed on a second face 83b of the substrate 83.

Since the dislocation density in the epitaxial film 85 is reduced by use of the step flow growth, the leakage current in the reverse Schottky characteristics is small. The decrease of dislocation density is achieved by growing the epitaxial film 85 on the primary surface with the off angle of more than 5 degrees. The thickness of this epitaxial film 85 is not less than 3 micrometers and not more than 1000 micrometers, and the carrier concentration of the epitaxial film 85 is not less than $1 \times 10^{14}$ cm$^{-3}$ and not more than $1 \times 10^{17}$ cm$^{-3}$.

This epitaxial substrate 81 may be configured in such a manner that a p-type semiconductor region is formed on the epitaxial film 85 and that an n-type semiconductor region is formed in this p-type semiconductor region. As a result, the epitaxial substrate for a transistor with improvement in breakdown voltage is provided.

FIGS. 9 (d) to (g) are figures showing a method for fabricating an epitaxial wafer and a method for a III nitride semiconductor electronic device. As shown in FIG. 9 (d) and FIG. 9 (e), the epitaxial wafer 81 is produced. As shown in FIG. 9 (f), a p-type nitride semiconductor epitaxial film 93 is grown on the epitaxial wafer 81 in the growth reactor 10 to produce an epitaxial wafer 91. The p-type nitride semiconductor epitaxial film 93 is grown, for example, by the metal-organic vapor phase epitaxial process. Since the carrier concentration of the p-type nitride semiconductor epitaxial film 93 is larger than that of the epitaxial film 85, a depletion layer in the pn junction is formed mainly in the epitaxial film 85.

As shown in FIG. 9 (g), an ohmic electrode film 95 is deposited on the epitaxial film 93 of this epitaxial wafer 91, and an ohmic electrode film 97 is deposited on the second face 83b of the substrate 83.

Since the dislocation density in the epitaxial film 85 is reduced by use of the step flow growth, the leakage current in the reverse pn junction characteristics is small. The decrease of dislocation density is achieved by growing the epitaxial film 85 on the primary surface with the off angle of more than 5 degrees. The thickness of this epitaxial film 85 is not less than 3 micrometers and not more than 1000 micrometers, and the carrier concentration of the epitaxial film 85 is not less than $1 \times 10^{14}$ cm$^{-3}$ and not more than $1 \times 10^{17}$ cm$^{-3}$. As described above, the epitaxial substrate 91 for a semiconductor device with improvement in breakdown voltage is provided.

FIG. 10 (a) is a figure showing an arrangement of high-dislocation and low-dislocation regions in a GaN free-standing substrate. A first face 82a of a nitride semiconductor free-standing substrate 82 has a first area where a low-dislocation region 82d with a small threading dislocation density appears, and second areas where high-dislocation regions 82c with a large threading dislocation density appear. The high-dislocation regions 82c are surrounded by the low-dislocation region 82d and in the first face 82a the second areas are distributed at random in a dot pattern in the first area. The total threading dislocation density is, for example, not more than $1 \times 10^8$ cm$^{-2}$. Since the dislocation density is small in the aforementioned epitaxial substrates 81 and 91, dislocations decrease in the epitaxial film. For this reason, the reverse leakage current decreases and the reverse breakdown voltage improves.

FIG. 10 (b) is a figure showing another arrangement of high-dislocation and low-dislocation regions in a GaN free-standing substrate. A first face 84a of a nitride semiconductor free-standing substrate 84 has first areas where low-dislocation regions 84d with a small threading dislocation density appear, and second areas where high-dislocation regions 84c with a large threading dislocation density appear. The high-dislocation regions 84c and the low-dislocation regions 84d are alternately arranged and, for example, the first and second areas can be periodically arrayed in the first face 84a.

The nitride semiconductor free-standing substrates 82 and 84 can be used for the epitaxial wafers 81 and 91. The dislocation density of the first areas can be not more than $1 \times 10^8$ cm$^{-2}$, and the dislocation density of the second areas can be larger than $1 \times 10^8$ cm$^{-2}$.

As the GaN free-standing substrate of FIG. 10 (a) becomes larger, threading dislocations in the low-dislocation region couple with each other to annihilate. In the high-dislocation regions, steps develop from the low-dislocation regions having little influence of threading dislocations but having strong influence of the step flow growth, so as to bury the high-dislocation regions (regions with the same polarity as the low-dislocation regions) where the progress of step flow growth is slow, whereby the leakage current of the Schottky junction and pn junction is also significantly reduced in the high-dislocation regions, thereby improving the breakdown voltage. As described with reference to FIG. 2, a facet is formed in a region in the high-dislocation regions where the step flow growth is slow. The area of this facet becomes smaller in the surface of the epitaxial film with increase in off angle, thereby reducing the area of the high-dislocation regions. This improves the device yield.

The high breakdown voltage semiconductor device using the III nitride semiconductor according to the present embodiment demonstrates the higher reverse breakdown voltage and smaller forward on-resistance than the semiconductor devices using the silicon semiconductor.

The principle of the present invention has been illustrated and described in the preferred embodiments, and it can be understood by those skilled in the art that the present invention can be modified in arrangement and detail without departing from the principle of the present invention. The present invention is by no means limited to the specific configurations disclosed in the embodiments of the present invention. For example, the above described the transistors of the normally off type, but the present invention is not limited to this type. Therefore, the applicants claim all modifications and changes falling within the scope of claims and coming from the scope of spirit thereof.

LIST OF REFERENCE SIGNS

11a . . . . Schottky diode;
11b . . . pn junction diode;
11c . . . MIS type transistor;
13 . . . substrate;
17 . . . III nitride semiconductor epitaxial film;
19 . . . first conductivity type III nitride semiconductor layer;
21 . . . second conductivity type III nitride semiconductor layer;
23 . . . . Schottky electrode;
25, 27, 29 . . . ohmic electrodes;
57 . . . separation region;
59 . . . source semiconductor region;
61 . . . source electrode;
63 . . . drain electrode;
71 . . . III nitride semiconductor MIS type transistor;
75 . . . gate electrode;
77 . . . insulating layer.

The invention claimed is:

1. A III nitride semiconductor electronic device comprising:
 a support base of a III nitride semiconductor having a carrier concentration of more than $1 \times 10^{18}$ cm$^{-3}$, the support base including a first face and a second face opposite to the first face; and
 a first III nitride semiconductor epitaxial layer provided on the first face of the support base,
 the first III nitride semiconductor epitaxial layer making a junction with the first face of the support base,
 the first face of the support base being inclined at an angle of more than 5 degrees with respect to a reference axis, and the reference axis extending in a direction of a c-axis of the III nitride semiconductor,
 the first III nitride semiconductor epitaxial layer including first, second and third regions arranged in order in a direction of a normal to the first face,
 a dislocation density of the second region being smaller than a dislocation density of the support base, and a dislocation density of the third region being smaller than a dislocation density of the first region.

2. The III nitride semiconductor electronic device according to claim 1, wherein a surface of the first III nitride semiconductor epitaxial layer has a morphology including a step structure, and the step structure has plural crystal planes.

3. The III nitride semiconductor electronic device according to claim 1, wherein the first face of the support base is inclined at an angle of not less than 20 degrees with respect to the reference axis.

4. The III nitride semiconductor electronic device according to claim 1, wherein the first face of the support base is inclined at an angle of not less than 40 degrees and not more than 80 degrees with respect to the reference axis.

5. The III nitride semiconductor electronic device according to claim 1, wherein the first face of the support base has a first area and a second area,
wherein a dislocation density of the first area is not more than $1 \times 10^8$ cm$^{-2}$, and
wherein a dislocation density of the second area is more than $1 \times 10^8$ cm$^{-2}$.

6. The III nitride semiconductor electronic device according to claim 1, wherein a thickness of the first III nitride semiconductor epitaxial layer is not less than 3 micrometers, and
wherein a carrier concentration of the first III nitride semiconductor epitaxial layer is not less than $1 \times 10^{14}$ cm$^{-3}$ and not more than $1 \times 10^{17}$ cm$^{-3}$.

7. The III nitride semiconductor electronic device according to claim 1, wherein a thickness of the first III nitride semiconductor epitaxial layer is not less than 5 micrometers, and
wherein a carrier concentration of the first III nitride semiconductor epitaxial layer is not less than $1 \times 10^{14}$ cm$^{-3}$ and not more than $2 \times 10^{16}$ cm$^{-3}$.

8. The III nitride semiconductor electronic device according to claim 1, wherein a thickness of the first III nitride semiconductor epitaxial layer is not more than 100 micrometers.

9. The III nitride semiconductor electronic device according to claim 1, further comprising a Schottky electrode, the Schottky electrode making a Schottky junction with the first III nitride semiconductor epitaxial layer.

10. The III nitride semiconductor electronic device according to claim 1, further comprising:
a second III nitride semiconductor epitaxial layer provided on the first III nitride semiconductor epitaxial layer; and
an ohmic electrode making an ohmic contact with the second III nitride semiconductor epitaxial layer, the second III nitride semiconductor epitaxial layer having a conductivity type opposite to a conductivity type of the first III nitride semiconductor epitaxial layer.

11. The III nitride semiconductor electronic device according to claim 10, wherein the second III nitride semiconductor epitaxial layer and the first III nitride semiconductor epitaxial layer form a homojunction.

12. The III nitride semiconductor electronic device according to claim 10, wherein the second III nitride semiconductor epitaxial layer includes first, second and third regions arranged in order in a direction of a normal to the first face, and
wherein a dislocation density of the third region of the second III nitride semiconductor epitaxial layer is smaller than a dislocation density of the first region of the second III nitride semiconductor epitaxial layer.

13. The III nitride semiconductor electronic device according to any claim 1, comprising:

a source region comprising an n-type III nitride semiconductor;
a separation region provided between the first III nitride semiconductor epitaxial layer and the source region, the separation region comprising a p-type III nitride semiconductor;
an insulating film provided on a surface of the separation region; and
a gate electrode for changing a potential on the surface of the separation region through the insulating film, a conductivity type of the first III nitride semiconductor epitaxial layer is n-type.

14. The III nitride semiconductor electronic device according to claim 1, wherein in the first III nitride semiconductor epitaxial layer, a dislocation having a first Burgers vector is decomposed into a plurality of dislocations, and the first Burgers vector is equal to the sum of respective Burgers vectors of the plurality of dislocations, and
wherein in the first III nitride semiconductor epitaxial layer, a dislocation having a second Burgers vector incorporates with a dislocation having a third Burgers vector, and the third Burgers vector has a component in a direction opposite to the second Burgers vector.

15. A method of fabricating a III nitride semiconductor electronic device, comprising the steps of:
preparing a wafer of a III nitride semiconductor, the III nitride semiconductor having a carrier concentration of more than $1 \times 10^{18}$ cm$^{-3}$, the wafer having a primary surface inclined at an angle of more than 5 degrees with respect to a reference axis, and the reference axis extending in a direction of a c-axis of the III nitride semiconductor; and
growing a first III nitride semiconductor epitaxial layer on the primary surface of the wafer,
the first III nitride semiconductor epitaxial layer making a junction with the primary surface of the wafer,
the first III nitride semiconductor epitaxial layer including first, second and third regions arranged in order in a direction of a normal to the primary surface,
a dislocation density of the second region being smaller than a dislocation density of the wafer, and a dislocation density of the third region being smaller than a dislocation density of the first region.

16. The method according to claim 15, wherein the first III nitride semiconductor epitaxial layer is grown by either of a metal-organic vapor phase epitaxial method and an HVPE method.

17. The method according to claim 15, further comprising the step of forming a Schottky electrode on the first III nitride semiconductor epitaxial layer.

18. The method according to claim 15, further comprising the steps of:
growing a second III nitride semiconductor epitaxial layer on the first III nitride semiconductor epitaxial layer; and
forming an ohmic electrode on the second III nitride semiconductor epitaxial layer,
the second III nitride semiconductor epitaxial layer having a conductivity type opposite to a conductivity type of the first III nitride semiconductor epitaxial layer.

19. A III nitride semiconductor epitaxial wafer for a III nitride semiconductor electronic device, comprising:
a wafer of a III nitride semiconductor, the III nitride semiconductor having a carrier concentration of more than $1 \times 10^{18}$ cm$^{-3}$, and the wafer including a first face and a second face opposite to the first face; and
a first III nitride semiconductor epitaxial layer provided on the first face of the wafer, the first III nitride semiconductor epitaxial film making a junction with the first face of the wafer, the first face of the wafer being inclined at an angle of more than 5 degrees with respect to a reference axis, and the reference axis extending in a direction of a c-axis of the III nitride semiconductor, the first III nitride semiconductor epitaxial layer including first, second and third regions, the first, second and third regions being arranged in order in a direction of a normal to the first face, a dislocation density of the second region being smaller than a dislocation density of the wafer, and a dislocation density of the third region being smaller than a dislocation density of the first region.

20. The III nitride semiconductor epitaxial wafer according to claim 19, further comprising a second III nitride semiconductor epitaxial layer provided on the first III nitride semiconductor epitaxial layer, the second III nitride semiconductor epitaxial layer having a conductivity type opposite to a conductivity type of the first III nitride semiconductor epitaxial layer.

* * * * *